(12) United States Patent
Nakajima et al.

(10) Patent No.: US 7,405,720 B2
(45) Date of Patent: Jul. 29, 2008

(54) ANALOG BUFFER CIRCUIT, DISPLAY DEVICE AND PORTABLE TERMINAL

(75) Inventors: Yoshiharu Nakajima, Kanagawa (JP); Yoshitoshi Kida, Kanagawa (JP); Toshikazu Maekawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 763 days.

(21) Appl. No.: 10/485,294

(22) PCT Filed: May 30, 2003

(86) PCT No.: PCT/JP03/06856

§ 371 (c)(1),
(2), (4) Date: Jan. 29, 2004

(87) PCT Pub. No.: WO03/103140

PCT Pub. Date: Dec. 11, 2003

(65) Prior Publication Data

US 2004/0183772 A1   Sep. 23, 2004

(30) Foreign Application Priority Data

May 31, 2002   (JP) .............................. 2002-159029

(51) Int. Cl.
*G09G 3/36* (2006.01)
(52) U.S. Cl. ...................................... 345/100; 345/204
(58) Field of Classification Search ............. 345/87–90, 345/92, 94, 95–96, 98–100, 204–205, 214; 349/37, 41
See application file for complete search history.

(56) References Cited

U.S. PATENT DOCUMENTS

| | | | |
|---|---|---|---|
| 5,739,816 A | 4/1998 | Kobayashi et al. | |
| 6,313,819 B1 | 11/2001 | Maekawa et al. | |
| 6,738,037 B1 * | 5/2004 | Akimoto | 345/96 |
| 6,784,865 B2 * | 8/2004 | Akimoto et al. | 345/98 |
| 6,791,613 B2 * | 9/2004 | Shinohara et al. | 348/308 |
| 2002/0033786 A1 * | 3/2002 | Akimoto et al. | 345/87 |

FOREIGN PATENT DOCUMENTS

| | | |
|---|---|---|
| JP | 06-252724 | 9/1994 |
| JP | 6-252724 A | 9/1994 |
| JP | 09-330060 | 12/1997 |
| JP | 9-330060 A | 12/1997 |
| JP | 11-073165 | 3/1999 |

(Continued)

*Primary Examiner*—Richard Hjerpe
*Assistant Examiner*—Mansour M Said
(74) *Attorney, Agent, or Firm*—Robert J. Depke; Rockey, Depke & Lyons, LLC

(57) ABSTRACT

An analog buffer circuit which has small input and output offsets and reduced power consumption even if it is formed on an insulating substrate by TFTs, a display device which uses the analog buffer circuit as a peripheral driving circuit for a display unit, and a portable terminal in which the display device is provided as a screen display unit are provided. By performing offset detection on a source follower in such a manner that, for example, two capacitors Cn1 and Cn2 are connected to the gate of a NMOS transistor Qn11 as a source follower, and conduction/nonconduction control of switches Sn1 to Sn5 are performed, if needed, and by sequentially canceling the detected offsets, a final offset voltage is sufficiently reduced and high precision offset cancellation is realized.

5 Claims, 24 Drawing Sheets

FOREIGN PATENT DOCUMENTS

| | | |
|---|---|---|
| JP | 11-73165 A | 3/1999 |
| JP | 2001-125546 | 5/2001 |
| JP | 2002-014644 | 1/2002 |
| JP | 2002-041001 | 2/2002 |
| JP | 2002-057537 | 2/2002 |
| JP | 2002-57537 A | 2/2002 |
| JP | 2002-108296 | 4/2002 |

* cited by examiner

ANALOG BUFFER CIRCUIT, DISPLAY DEVICE AND PORTABLE TERMINAL

This application claims priority to Japanese Patent Application Number JP2002-159029, filed May 31, 2002 which is incorporated herein by reference.

TECHNICAL FIELD

The present invention relates to analog buffer circuits, display devices, and portable terminals, and in particular, to an analog buffer circuit formed by thin film transistors (TFTs) on an insulating substrate, a display device using the analog buffer circuit as a peripheral driving circuit for a display unit, and a portable terminal provided with the display device as a screen display unit.

BACKGROUND ART

In the field of flat-panel display devices as typified by liquid crystal display devices and EL (electroluminescence) display devices, in recent years, in order to achieve panel frame narrowness and reduced panel thickness, a so-called driver-integrated display device has been developed in which, on the same transparent substrate with a display unit composed of pixels arranged in a matrix, a peripheral driving circuit for driving the display unit is provided in an integrated form. Since TFTs are used as pixel transistors in liquid crystal display devices and EL display devices, regarding mounting of the driving circuit on the transparent substrate, the driving circuit is also formed by TFTs.

As the peripheral driving circuit for the display device, an analog buffer circuit is used in many cases in order to increase a driving capability. Here, the case of using TFTs to form the analog buffer circuit on the insulating substrate is considered. In TFTs, the absolute value of threshold value Vth is large and its variation is greatly large. Also, it is known that, when TFTs are formed on an insulating substrate such as a glass substrate, the element characteristics of the TFTs are worse than those in the case of TFTs formed on a silicon substrate. As described above, since the absolute value of threshold value Vth of the TFT is large and its variation is greatly large, when TFTs are used to form an analog buffer circuit on the insulating substrate, input and output offsets of the analog buffer circuit and their variations increase.

It is assumed that a plurality of the analog buffer circuit be arranged for, for example, an output unit of a data driver (horizontal driver) in a driver-integrated display device so as to correspond to data lines (signal lines) in the display unit. In this case, large variations in the input and output offsets of the analog buffer circuit cause a large output-potential error in each circuit. Then, this output-potential error is a potential difference between columns of the display unit, and is displayed as a vertical stripe on the screen. Accordingly, this greatly deteriorates display quality (uniformity).

Also, in the case of using TFTs to form an analog circuit on an insulating substrate, a large absolute value of TFT threshold value Vth causes large power consumption because a high power-supply voltage and a large idling current are required for circuit driving. Accordingly, this is a disadvantage in reducing power consumption of the display device, although a driver-integrated configuration is established.

In view of the above problems, the present invention is made and an object thereof is to provide an analog buffer circuit in which, even if the analog buffer circuit is formed by TFTs on an insulating substrate, it has small input and output offsets and less power consumption, a display device in which the analog buffer circuit is used as a peripheral driving circuit for a display unit, and a portable terminal provided with the display device as a screen display unit.

DISCLOSURE OF INVENTION

An analog buffer circuit of the present invention has a configuration comprising a source-follower means which drives an output load, and an offset-canceling means which performs offset detection in the source-follower means a plural number of separate times and which sequentially cancels the detected offsets. This analog buffer circuit is used, in a display device formed including a DA converting circuit which supplies analog display signals to data lines in a display unit after converting digital display signals into the analog display signals and which is provided on the same transparent insulating substrate, with the display unit, for example, for an output unit in the DA converting circuit. Also, a display device which includes a DA converting circuit using the analog buffer circuit is provided as a screen display unit of a portable terminal as typified by a PDA (Personal Digital Assistants) or a cellular telephone.

In a portable terminal in which an analog buffer circuit having the above configuration, a display device using part of a DA converting circuit, or the display device as a screen display unit is provided, by performing offset detection in a source follower a plural number of separate times, detection of a final offset voltage is performed much closer to the operating point of a final output mode compared with detection of a first offset voltage. Accordingly, since the final offset voltage is very close to the finally detected offset voltage and both substantially cancel each other, the final offset voltage is sufficiently reduced.

BEST MODE FOR CARRYING OUT THE INVENTION

Embodiments of the present invention are described in detail with reference to the drawings.

[First Embodiment]

Figure 1:
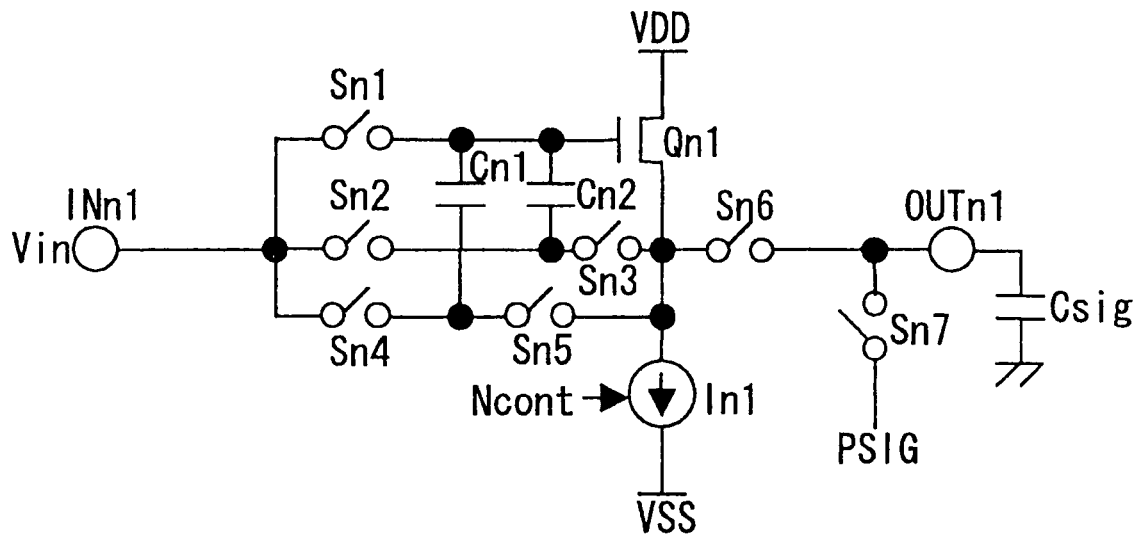
FIG. 1 is a circuit diagram showing an example of an N-type-buffer analog buffer circuit according to a first embodiment of the present invention.

FIG. 1 is a circuit diagram showing an example of an N-type-buffer analog buffer circuit according to a first embodiment of the present invention. This N-type-buffer analog buffer circuit includes an NMOS transistor and is used when output-signal potential is relatively high, specifically when it is higher than particular fixed potential PSIG, which is described later.

In FIG. 1, between a first power supply (e.g., a positive power supply VDD) and a second power supply (e.g., a negative power supply VSS), a source-follower NMOS transistor Qn1 and a current source In1 are connected in series. A switch Sn1 is connected between a circuit input terminal INn1 and the NMOS transistor Qn1. A switch Sn2 and a switch Sn3 are connected in series between the circuit input terminal INn1 and the NMOS transistor Qn1, and a switch Sn4 and a switch Sn5 are also connected in series.

A capacitor Cn1 is connected between the gate (the output end of the switch Sn1) of the NMOS transistor Qn1 and the output end (the input end of the switch Sn5) of the switch Sn1. A capacitor Cn2 is connected between the gate of the NMOS transistor Qn1 and the output end (the input end of the switch Sn3) of the switch Sn2. The five switches Sn1 to Sn5 and the two capacitors Cn1 and Cn2 constitute an offset-canceling means which performs offset detection on a source follower (the NMOS transistor Qn1) two separate times and which sequentially cancels the detected offsets.

A switch Sn6 is connected between the NMOS transistor Qn1 and a circuit output terminal OUTn1. The circuit output terminal OUTn1 (the output end of the switch Sn6) connects to one end of a switch Sn7. The other end of the switch Sn7 is supplied with low-level (hereinafter referred to as "L" level) fixed potential PSIG as output-load precharge potential.

Figure 2:
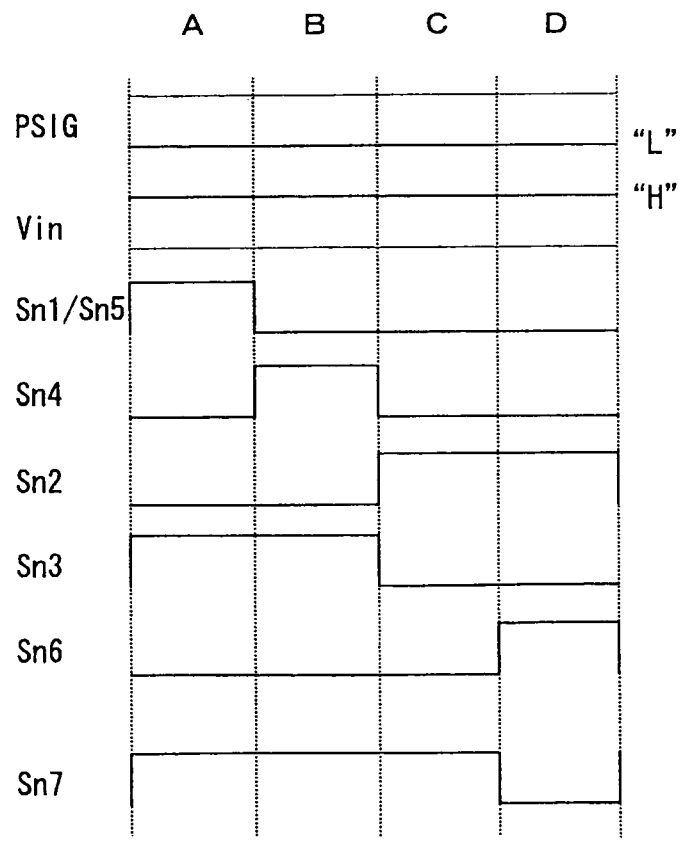
FIG. 2 is a timing chart serving to illustrate the operation of the N-type-buffer analog buffer circuit according to the first embodiment.

Next, a circuit operation of the N-type-buffer analog buffer circuit according to the first embodiment, which has the above configuration, is described by using the timing chart in FIG. 2. Basically, this analog buffer circuit performs outputting by sequentially performing the following four operations to complete 1-cycle operation.

At first, in a period A, the switch Sn7 is in conduction, and the fixed potential PSIG starts to precharge the output load. Also, the switches Sn1, Sn3, and Sn5 are in conduction, and a signal Vin is input to the gate of the NMOS transistor Qn1, thus connecting the two capacitors Cn1 and Cn2 across the gate and source of the NMOS transistor Qn1. This stores the gate-source voltage (VosA) of the NMOS transistor Qn1 in the capacitors Cn1 and Cn2.

Next, in a period B, the switches Sn1 and Sn5 are in nonconduction, and the switch Sn4 is in conduction. Then, the input signal Vin is supplied to the other electrode of the left capacitor Cn1. Thus, the gate voltage of the NMOS transistor Qn1 changes depending on the voltage stored in the capacitor Cn1. Also, the other capacitor Cn2 remains to be connected across the gate and source of the NMOS transistor Qn1. At this time, the gate-source voltage (VosB) is stored in the capacitor Cn2. Then, the source voltage is approximately Vin+(VosA−VosB).

Next, in a period C, the switches Sn3 and Sn4 are in nonconduction, and the switch Sn2 is in conduction. This inputs the signal Vin to the other electrode of the right capacitor Cn2, and the gate potential changes depending on the voltage stored in the capacitor Cn2. Let the gate-source voltage at this time be VosC, the source voltage is approximately n+(VosB−VosC).

Finally, in a period D, the switch Sn6 is in conduction, and the switch Sn7 is in nonconduction. This connects the output load to the source-follower output of the NMOS transistor Qn1, so that the source voltage n+(VosB−VosC) is output to the load. The operation in the period D can be performed so as to overlap with that in the period C from its beginning.

In the above operations, an important point is that, by performing offset detection on the source follower a number of separate times, twice in this embodiment, the detection of the offset voltage VosB the second time is performed much closer to an operation point in a final output mode than the detection of the offset voltage VosA the first time. This causes the offset voltage VosC to be very close to the offset voltage VosB, and the final offset voltage (VosB−VosC) is sufficiently small. In other words, very high precision offset cancellation is achieved.

In addition, when the source follower is in a basic form composed of an NMOS transistor, input and output offsets for the gate-source voltage Vgs of the NMOS transistor are generated. Also, in the case of offset cancellation in which offset detection on the source follower is performed once, an offset detecting mode and a final output mode have different NMOS-transistor operation points. The gate voltage to the drain voltage accordingly differs between the offset detecting mode and the final output mode. Thus, the offset cannot be completely canceled, so that the input and output offsets are still generated although an effect of offset cancellation is obtained, to some extent, compared with the basic form.

Conversely, in the N-type-buffer analog buffer circuit according to the first embodiment, by employing a configuration in which source-follower offset detection is performed two separate times, a final offset voltage can be sufficiently reduced and high precision offset cancellation can be performed. Thus, an analog buffer circuit having very low offsets and reduced variation in output potential is realized. This effect is more enhanced when there is a large difference in offset voltage caused by a difference (e.g., a difference in drain-source voltage Vds) in operation point of the NMOS transistor Qn1.

Therefore, the analog buffer circuit according to this embodiment is useful when the circuit is formed by using TFTs in each of which the absolute value of a threshold value Vth is large and its variation is very large, particularly when the circuit is formed by using TFTs on an insulating substrate such as a glass substrate on which a device characteristic of each TFT easily deteriorates. However, it is clear, from the above description of the operation, that the present invention is not limited to application to circuits formed by TFTs or to circuits formed by using TFTs on insulating substrates, but enables high-precision offset cancellation even in the case of other circuits.

Figure 3:
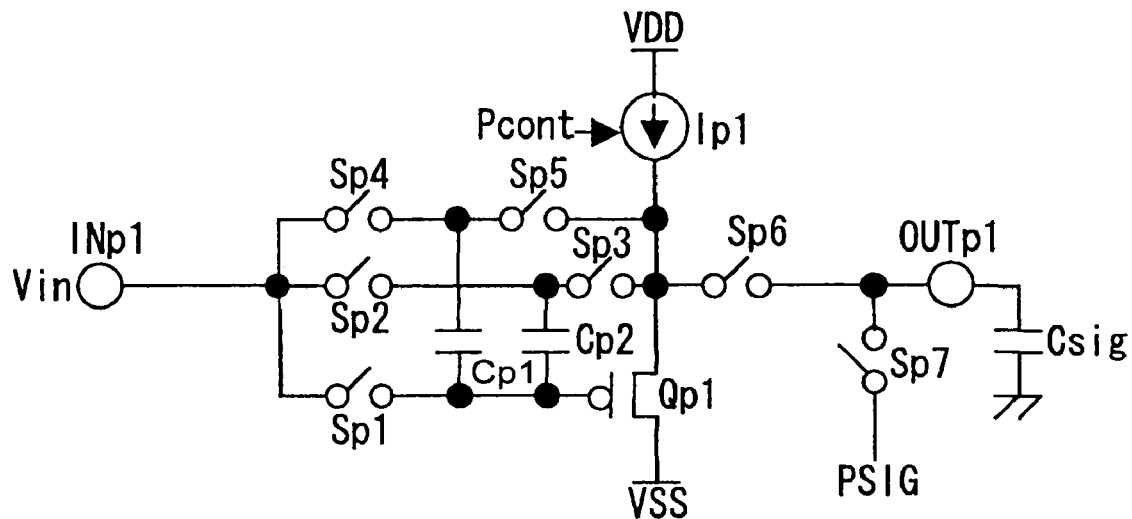
FIG. 3 is a circuit diagram showing an example of a P-type-buffer analog buffer circuit according to the first embodiment of the present invention.

FIG. 3 is a circuit diagram showing an example of a P-type-buffer analog buffer circuit according to the first embodiment of the present invention. The P-type-buffer analog buffer circuit includes a PMOS transistor and is used when output-signal potential is relatively low, specifically when it is lower than the particular fixed voltage PSIG.

In FIG. 3, a current source Ip1 and a P-type-buffer analog buffer circuit Qp1 as a source follower are connected in series between a power supply VDD and a power supply VSS. A switch Sp1 is connected between a circuit input terminal INp1 and the gate of the PMOS transistor Qp1. Between the circuit input terminal INp1 and the source of the PMOS transistor Qp1, a switch Sp2 and a switch Sp3 are connected in series, and a switch Sp4 and a switch Sp5 are connected in series.

A capacitor Cp1 is connected between the gate (the output end of a switch Sp1) of the PMOS transistor Qp1 and the output end (the input end of the switch Sp5) of the switch Sp4. A capacitor Cp2 is connected between the gate of the PMOS transistor Qp1 and the output end (the input end of the switch Sp3) of the switch Sp2. The five switches Sp1 to Sp5 and the two capacitors Cp1 and Cp2 constitute an offset-canceling means which performs offset detection on a source follower (the PMOS transistor Qp1) two separate times and sequentially cancels the detected offsets.

A switch Sp6 is connected between the source of the PMOS transistor Qp1 and a circuit output terminal OUTp1. The circuit output terminal OUTp1 (the output end of a switch Sp6) connects to one end of a switch Sp7. The other end of the switch Sp7 is supplied with high-level (hereinafter referred to as "HI" level) fixed potential PSIG as output-load precharge potential.

Figure 4:
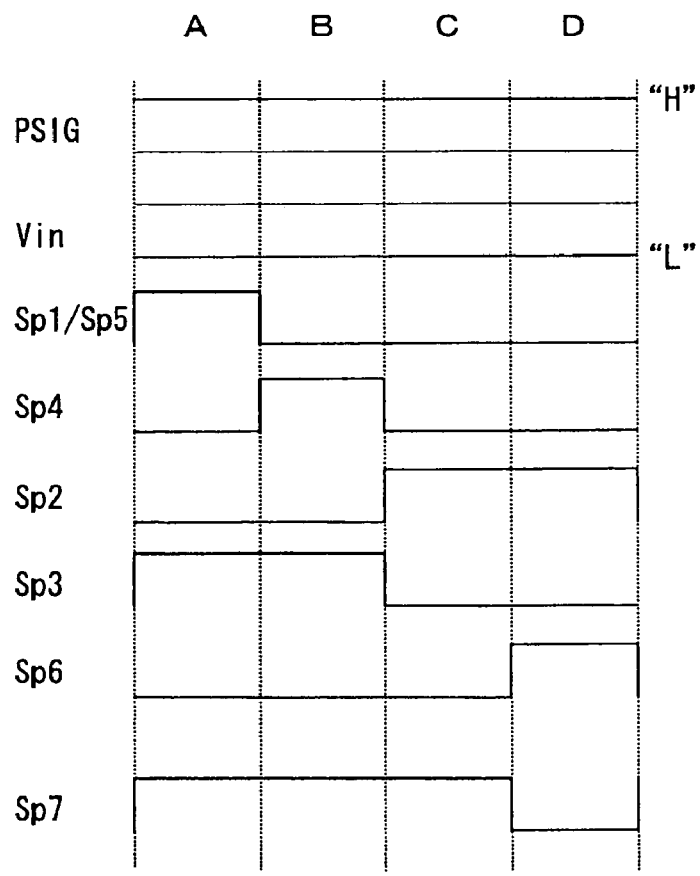
FIG. 4 is a timing chart serving to illustrate the operation of the P-type-buffer analog buffer circuit.

In the P-type-buffer analog buffer circuit having the above configuration, the switches Sp1 to Sp7 and the capacitors Cp1 and Cp2 respectively correspond to the switches Sn1 to Sn7 and the capacitors Cn1 and Cn2 in the above-described N-type-buffer analog buffer circuit (see FIG. 1), and the P-type-buffer analog buffer circuit is identical to the N-type-buffer analog buffer circuit in circuit operation. Its timing chart is shown in FIG. 4. Accordingly, it is identical to the N-type-buffer analog buffer circuit in operation and advantages.

(Application of First Embodiment)

Figure 5:
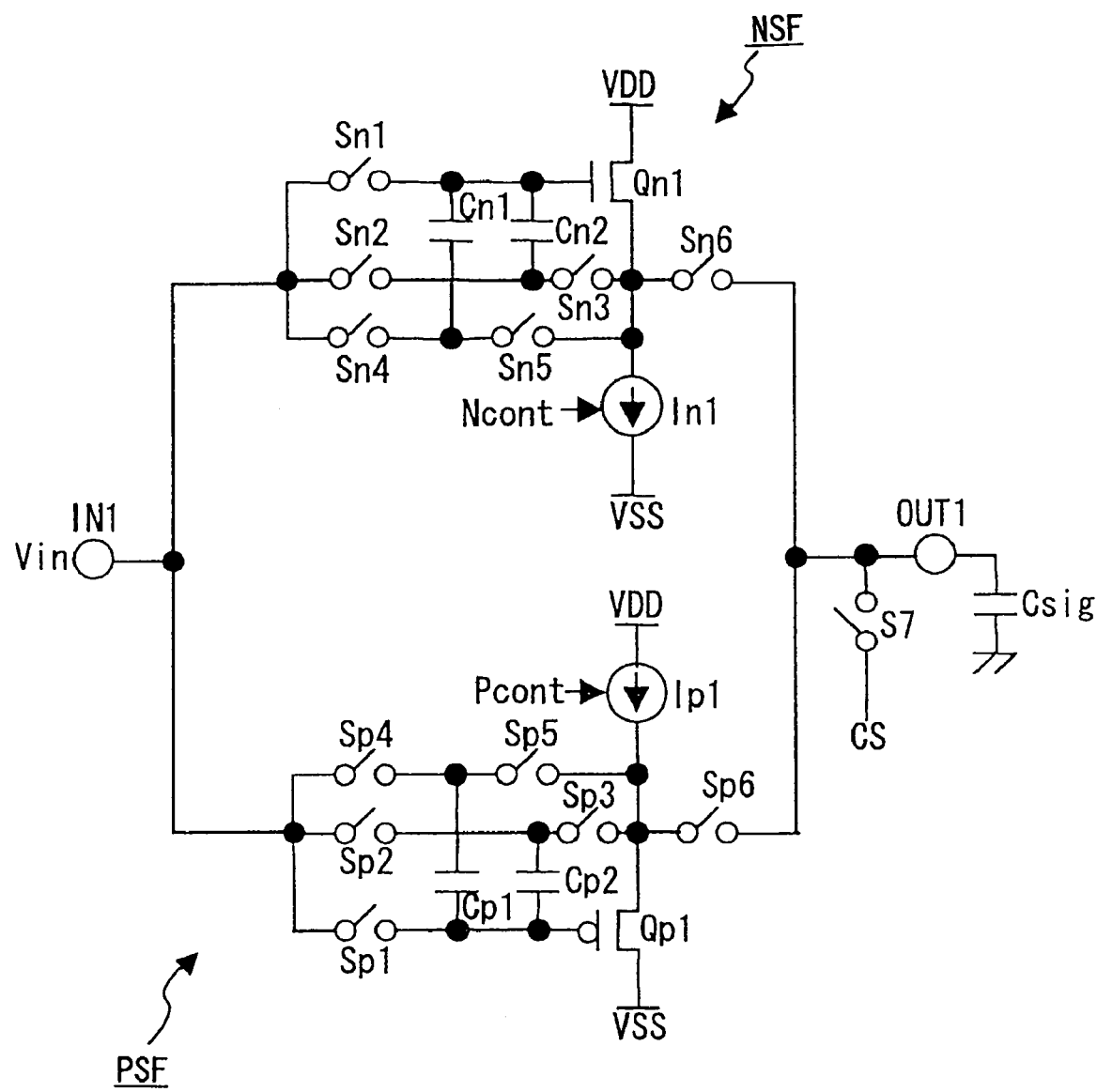
FIG. 5 is a circuit diagram showing an analog buffer circuit showing an analog buffer circuit according to an application of the first embodiment.

FIG. 5 is a circuit diagram showing an example of an analog buffer circuit according to an application of the first embodiment. Accordingly, equivalent portions in FIG. 1 and FIG. 3 are denoted by identical reference numerals. In the analog buffer circuit according to this application, in order to perform output load precharge in an alternating-current manner, a configuration that uses both an N-type-buffer analog buffer circuit and a P-type-buffer analog buffer circuit is employed.

Specifically, in FIG. 5, between a circuit input terminal IN1 and a circuit output terminal OUT1, an N-type-buffer analog buffer circuit (hereinafter referred to as an N-type source follower NSF) as shown in FIG. 1 and a P-type-buffer analog buffer circuit (hereinafter referred to as a P-type source follower PSF) as shown in FIG. 3 are connected in parallel. Also, the circuit output terminal OUT1 (the output ends of switches Sn6 and Sp6) connects to one end of a switch S7 (corresponding to switches Sn7 and Sp7). The other end of the switch S7 is supplied with alternating-current potential CS as output-load precharge potential.

Figure 6:
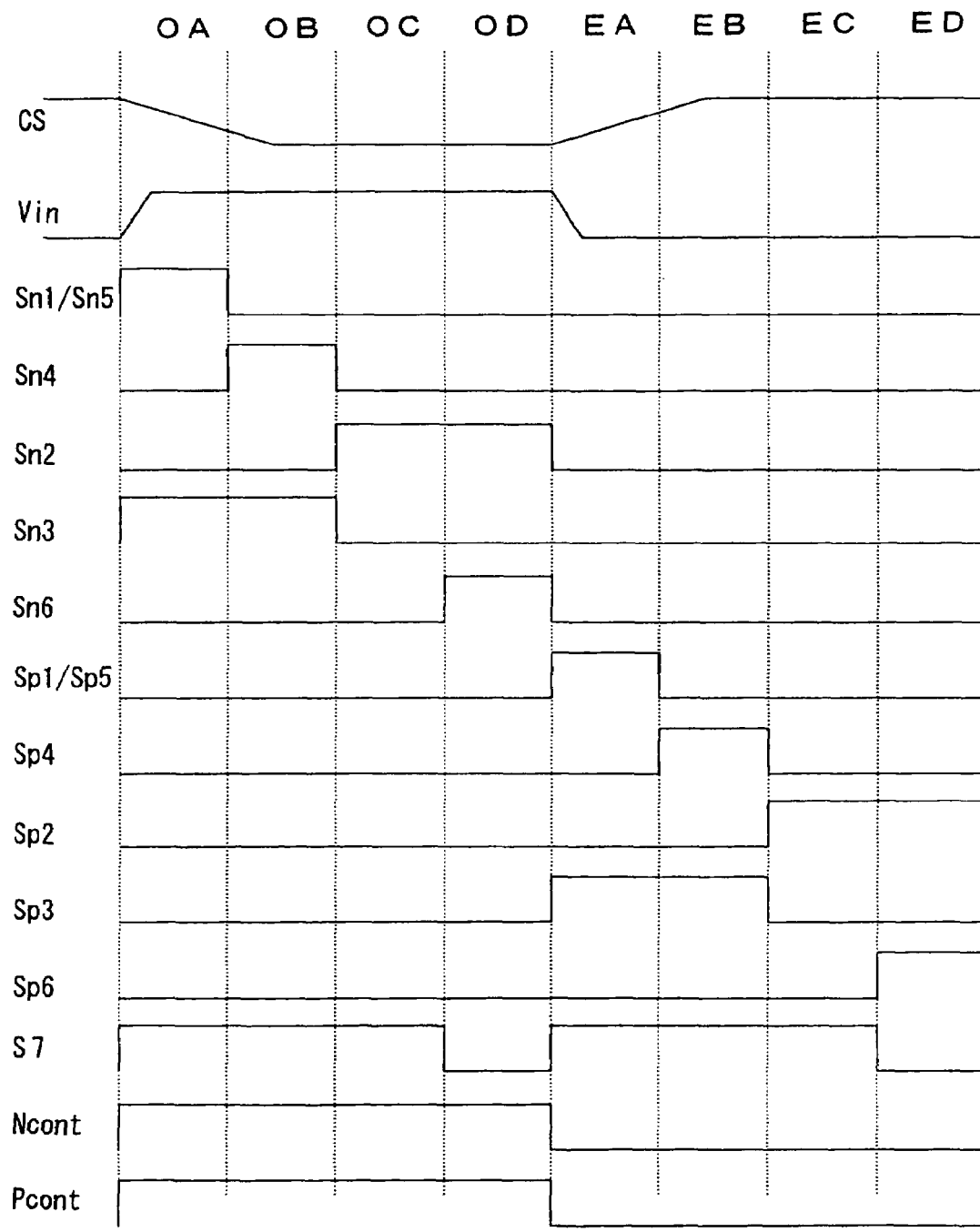
FIG. 6 is a timing chart serving to illustrate the operation of an analog buffer circuit according to an application of the first embodiment.

Next, circuit operations of the above-configuration analog buffer circuit according to the application are described with reference to the timing chart in FIG. 6 by using the operation illustrations in FIG. 7 to 14. In the timing chart in FIG. 6, from a period OA to a period OD, the N-type source follower NSF is active, while the P-type source follower PSF is not active. Also, from a period EA to a period ED, the P-type source follower PSF is active, while the N-type source follower NSF is not active.

Activeness/nonactiveness of the source follower NSF/PSF is realized by using a control signal Ncont/Pcont to control the current source In1/Ip1 of each source follower. The control signal Ncont/Pcont is output in accordance with the polarity of precharge potential CS. It is at "H" level when the precharge potential CS is at "L" level, and causes the N-type source follower NSF to be active. It is at "L" level when precharge potential CS is at "H" level, and causes the P-type source follower PSF to be active.

Figure 7:
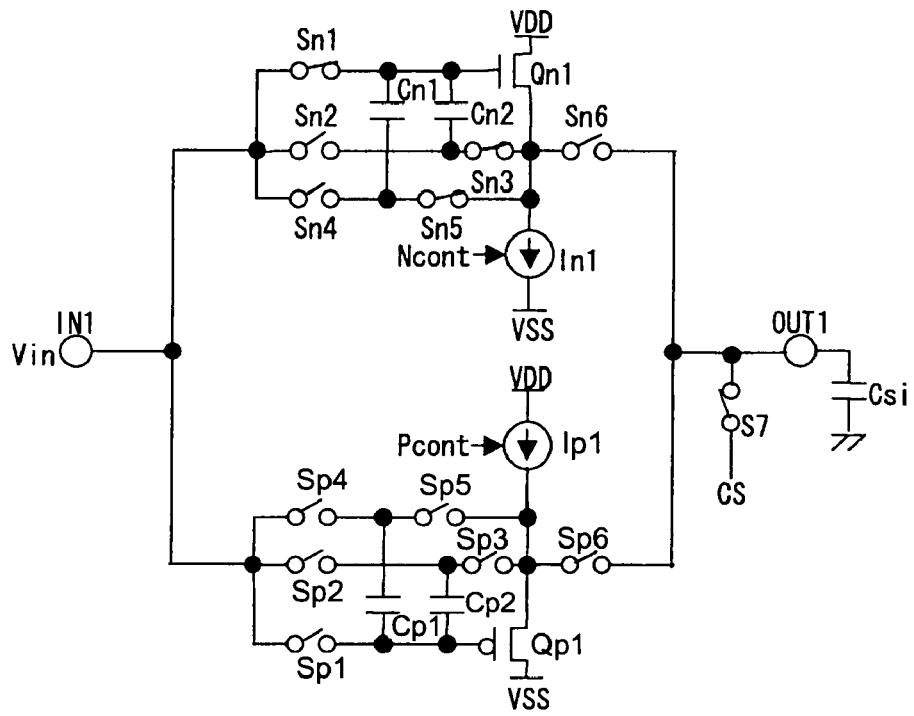
FIG. 7 is a diagram (#1) illustrating the operation of an N-type source follower in the analog buffer circuit according to the application of the first embodiment.

Specific circuit operations are as follows: At first, in the period OA, the analog buffer circuit has a connecting state as shown in FIG. 7. Specifically, the switches Sn1, Sn3, Sn5, and Sn7 of the N-type source follower are in conduction (closed), and its switches Sn2, Sn4, and Sn6 are in nonconduction (open). Then, all the switches of the P-type source follower PSF are in nonconduction, and this state continues up to the period OD.

In this state, the output load starts to be precharged at the CS potential, which is at "H" level, and the precharging continues to the period OD. Also, a signal Vin is input to the gate of an NMOS transistor Qn1, whereby two capacitors Cn1 and Cn2 are connected across the gate and source of the NMOS transistor Qn1. This stores the gate-source voltage (VosnA) in this state of the NMOS transistor Qn1 in the capacitors Cn1 and Cn2.

Figure 8:
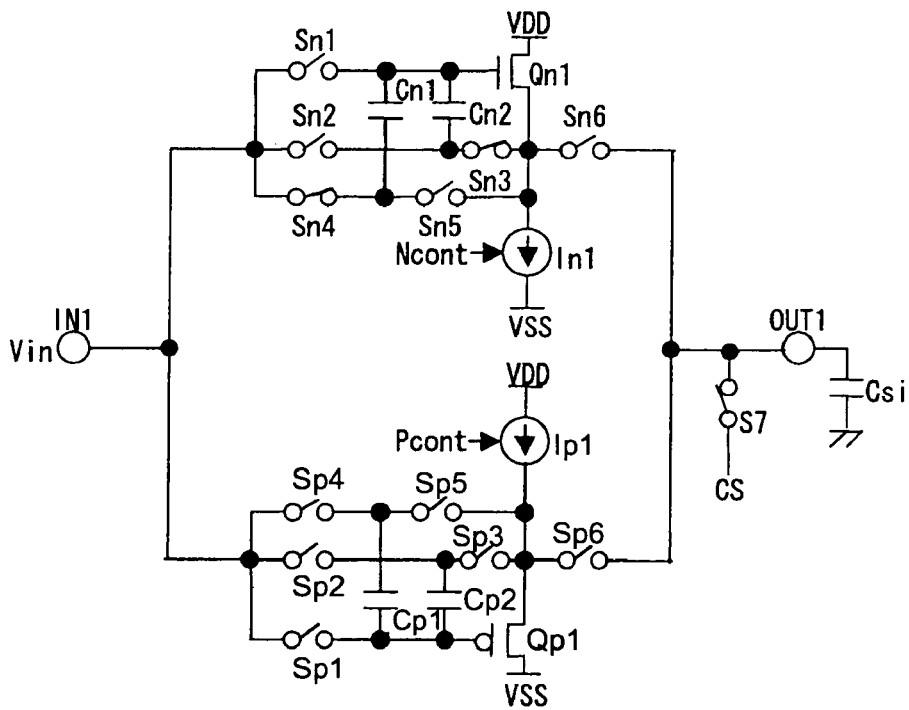
FIG. 8 is a diagram (#2) illustrating the operation of an N-type source follower in the analog buffer circuit according to the application of the first embodiment.

Next, in the period OB, the analog buffer circuit has a connecting state as shown in FIG. 8. Specifically, switches Sn1 and Sn5 in the N-type source follower NSF are in nonconduction, and a switch Sn4 is in conduction. Then, an input signal Vin is supplied to the other electrode of the left capacitor Cn1. Thus, the gate voltage of the NMOS transistor Qn1 changes depending on the voltage stored in the capacitor Cn1. Also, the other capacitor Cn2 is still connected across the gate and source of the NMOS transistor Qn1, and the gate-source voltage (VosB) at this time is stored in the capacitor Cn2. The source voltage in this state is approximately Vin+(VosA−VosB).

Figure 9:
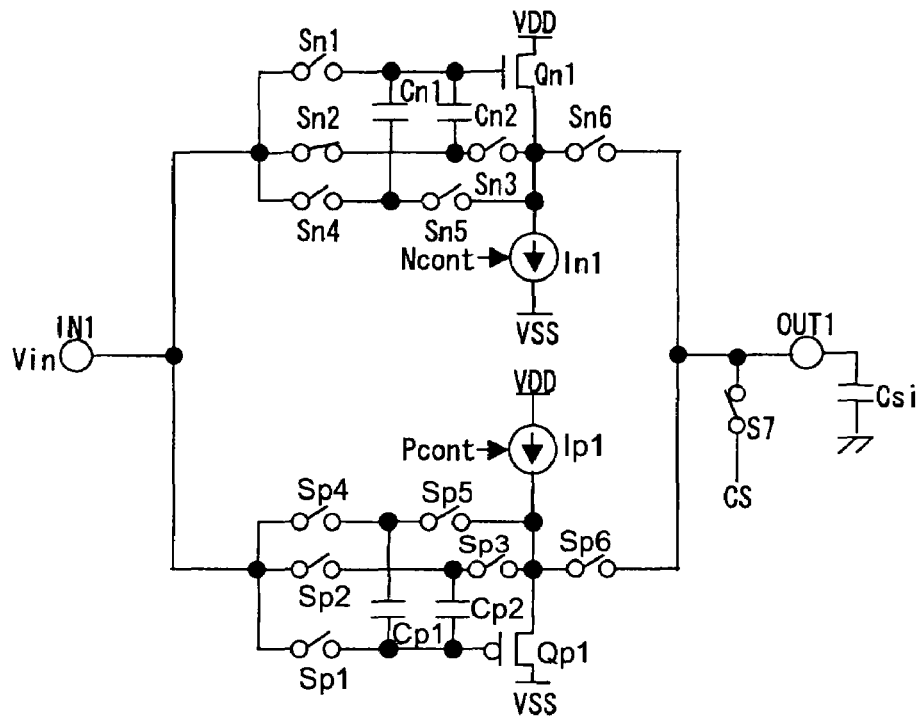
FIG. 9 is a diagram (#3) illustrating the operation of an N-type source follower in the analog buffer circuit according to the application of the first embodiment.

Next, in the period OC, the analog buffer circuit has a connecting state as shown in FIG. 9. Specifically, the switches Sn3 and Sn4 in the N-type source follower NSF are in nonconduction, and the switch Sn2 is in conduction. This inputs the signal Vin to the other electrode of the right capacitor Cn2, and the gate potential changes in accordance with the voltage stored in the capacitor Cn2. Let the gate-source voltage in this state be VosC, the source voltage is approximately n+(VosB−VosC).

Figure 10:
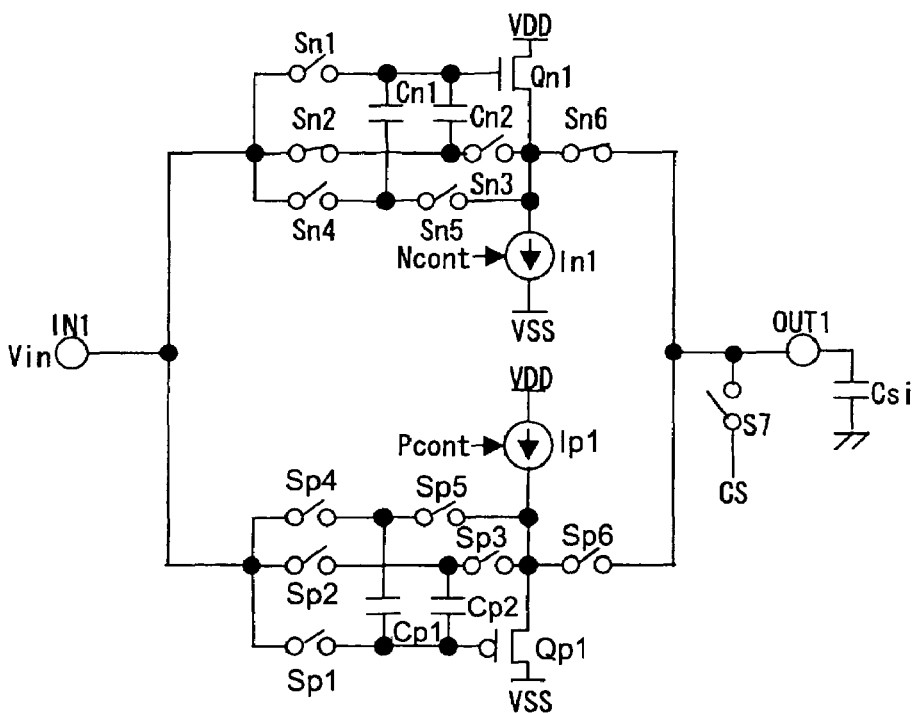
FIG. 10 is a diagram (#4) illustrating the operation of an N-type source follower in the analog buffer circuit according to the application of the first embodiment.
Figure 11:
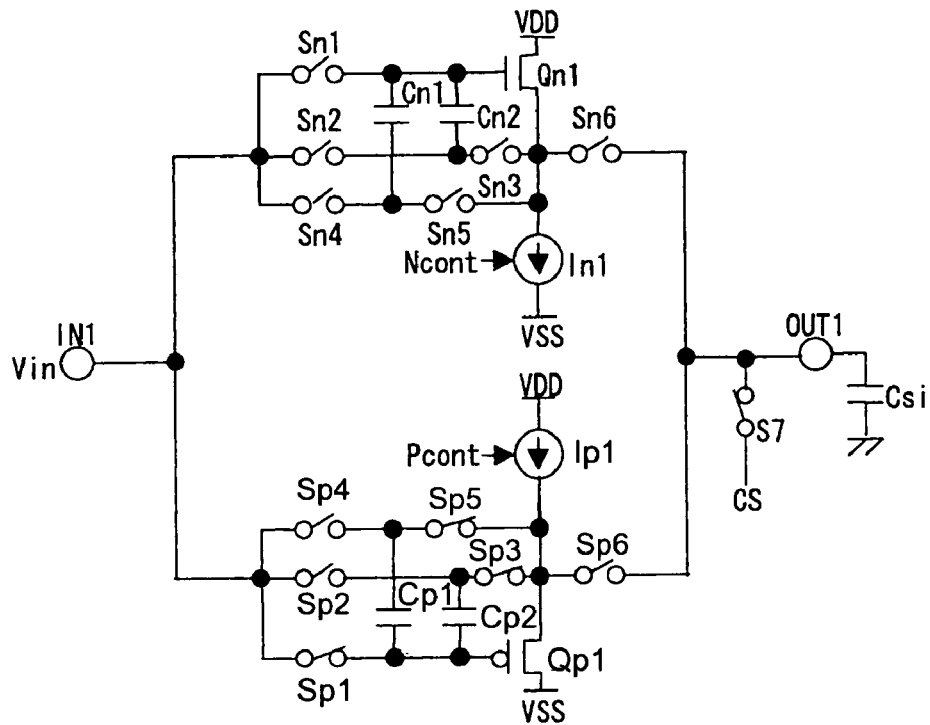
FIG. 11 is a diagram (#1) illustrating the operation of a P-type source follower in the analog buffer circuit according to the application of the first embodiment.
Figure 12:
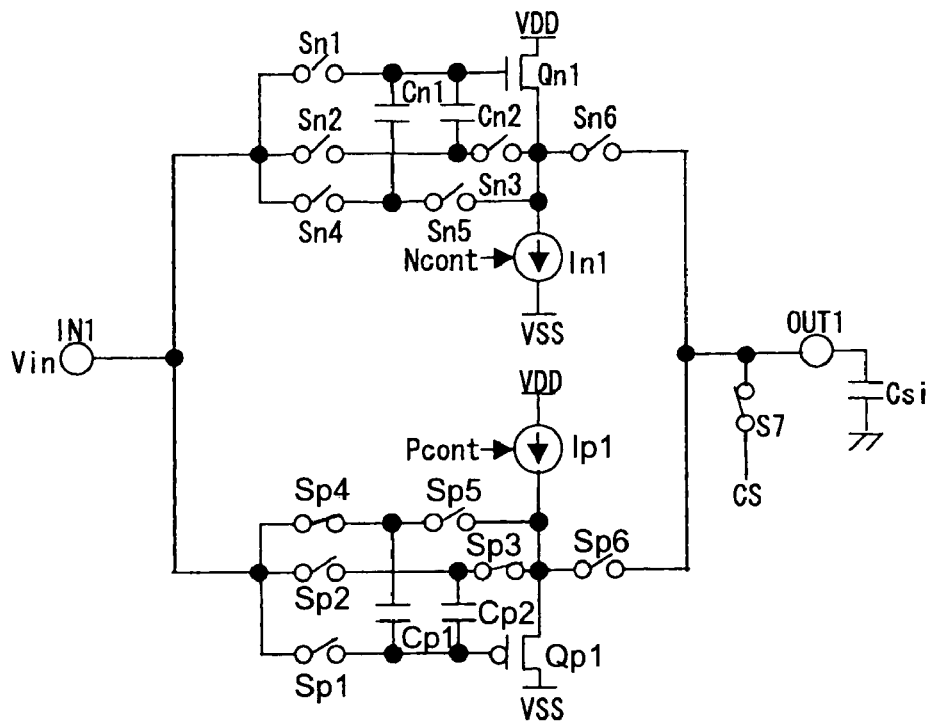
FIG. 12 is a diagram (#2) illustrating the operation of a P-type source follower in the analog buffer circuit according to the application of the first embodiment.
Figure 13:
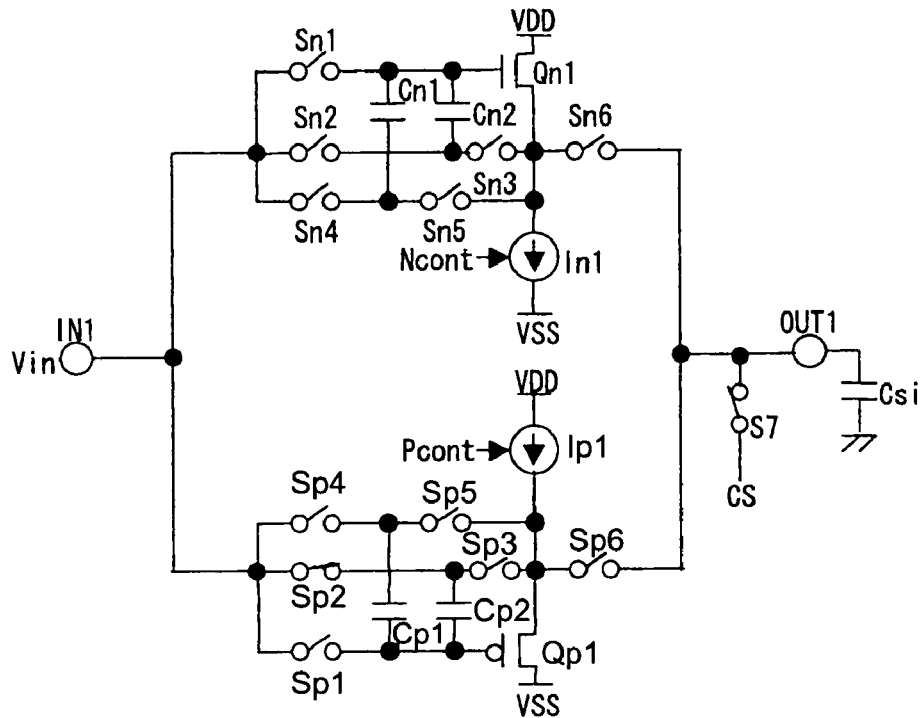
FIG. 13 is a diagram (#3) illustrating the operation of a P-type source follower in the analog buffer circuit according to the application of the first embodiment.
Figure 14:
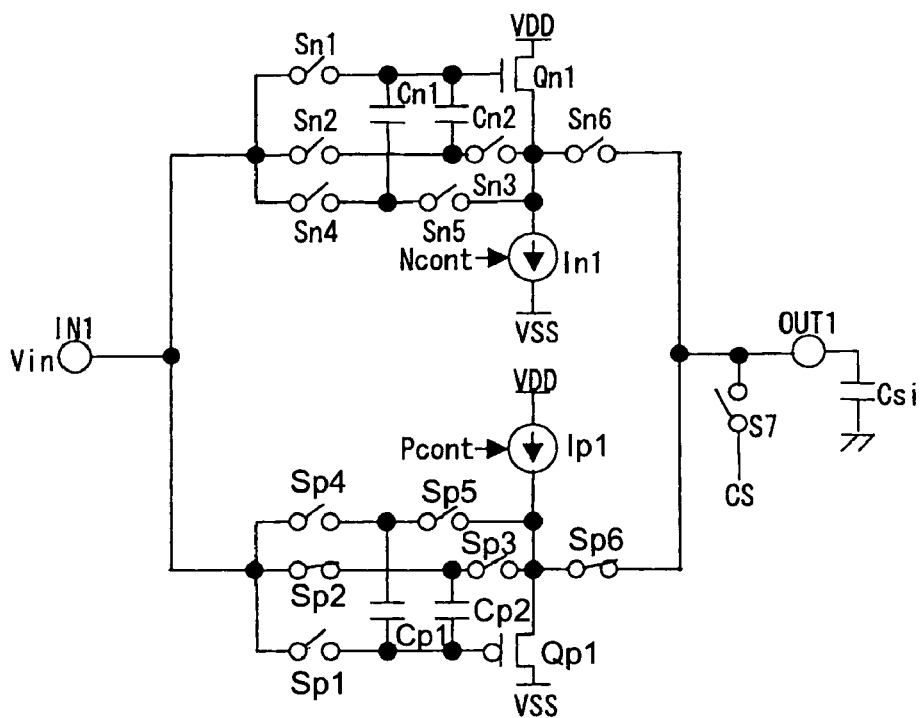
FIG. 14 is a diagram (#4) illustrating the operation of a P-type source follower in the analog buffer circuit according to the application of the first embodiment.

Finally, in the period OD, the analog buffer circuit has a connecting state as shown in FIG. 10. Specifically, the switch Sn6 in the N-type source follower NSF is in conduction, and the switch S7 is in nonconduction. This connects the output load to the source follower output (source) of the NMOS transistor Qn1, and outputs the source voltage Vin+(VosB−VosC) to the load.

Here, the operation point of the NMOS transistor Qn1 in the output mode and the operation point of the NMOS transistor Qn1 when a final offset is detected are very close to each other. Thus, VosB−VosC is very small, thus realizing low offsets.

In periods EA, EB, EC, and ED, the output load is precharged at the CS potential corresponding to "HI" level, and the P-type source follower PSF operates identically to the N-type source follower NSF to output a signal. Since circuit operations are similar, their description is omitted. FIG. 11 to FIG. 14 are illustrations of operations in the periods EA to ED.

As described above, by using, in combination, the precharge circuit (the switch S7) and the N-type source follower NSF and the P-type source follower PSF, whose voltages and connections are controlled in accordance with the polarity of the output voltage, the output load can be precharged to preferable potential ("H" level/"L" level) corresponding to the polarity of the output voltage.

As the current source In1 of the N-type source follower NSF and the current source Ip1 of the P-type source follower PSF, 1-transistor units composed of a single NMOS transistor and a single PMOS transistor are used respectively. Also, by using 3-transistor units as shown in FIG. 15 and FIG. 16, a variation in current is reduced, thus enabling reductions in offset voltage and output potential error.

Figure 15:
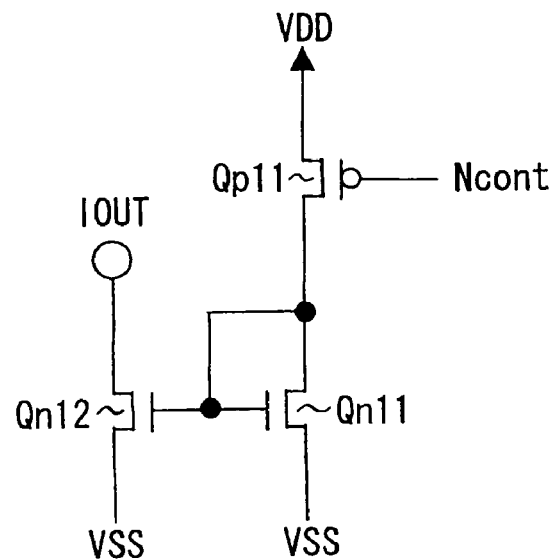
FIG. 15 is a circuit diagram showing an example of a current source for an N-type source follower.

The circuit shown in FIG. 15 is a current source for an N-type source follower NSF. In FIG. 15, a PMOS transistor Qp11 and an NMOS transistor Qn11 are connected in series between a power supply VDD and a power supply VSS. An "L" level control signal Ncont is supplied to the gate of the PMOS transistor Qp11. The NMOS transistor Qn11 has a gate and a drain which are short-circuited, and forms a current-mirror circuit by combining with an NMOS transistor Qn12 having a gate connected to the gate of the NMOS transistor Qn11. The NMOS transistor Qn12 is connected in series to the NMOS transistor Qn1 as a source follower, and its source is connected to the power supply VSS.

Figure 16:
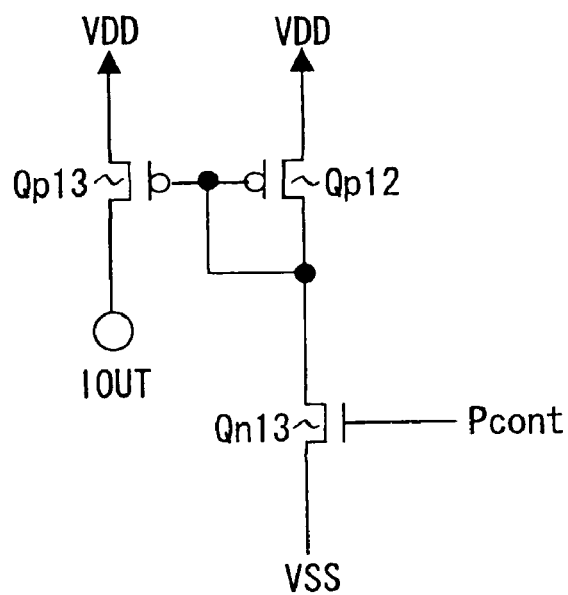
FIG. 16 is a circuit diagram showing an example of a current source for a P-type source follower.

The circuit shown in FIG. 16 is a current source for a P-type source follower PSF. In FIG. 16, a PMOS transistor Qp12 and an NMOS transistor Qn13 are connected in series. between a power supply VDD and a power supply VSS. An "H" level control signal Pcont is supplied to the gate of the NMOS transistor Qn13. The PMOS transistor Qp12 has a gate and a drain which are short-circuited, and forms a current-mirror circuit by combining with the NMOS transistor Qn13 having a gate connected to the gate of the PMOS transistor Qp12. The PMOS transistor Qn13 is connected in series to the PMOS transistor Qp1 as a source follower, and its source is connected to the power supply VDD.

Although, in the above-described analog buffer circuits according to the first embodiment and its application, a case in which source-follower offset detection is performed two separate times is described as an example, the number of times the offset detection is performed is not limited to twice, but may be three or more times. As the number of times increases, higher precision offset cancellation can be achieved. An analog buffer circuit in the case of performing offset detection three times is described below as a second embodiment.

[Second Embodiment]

Figure 17:
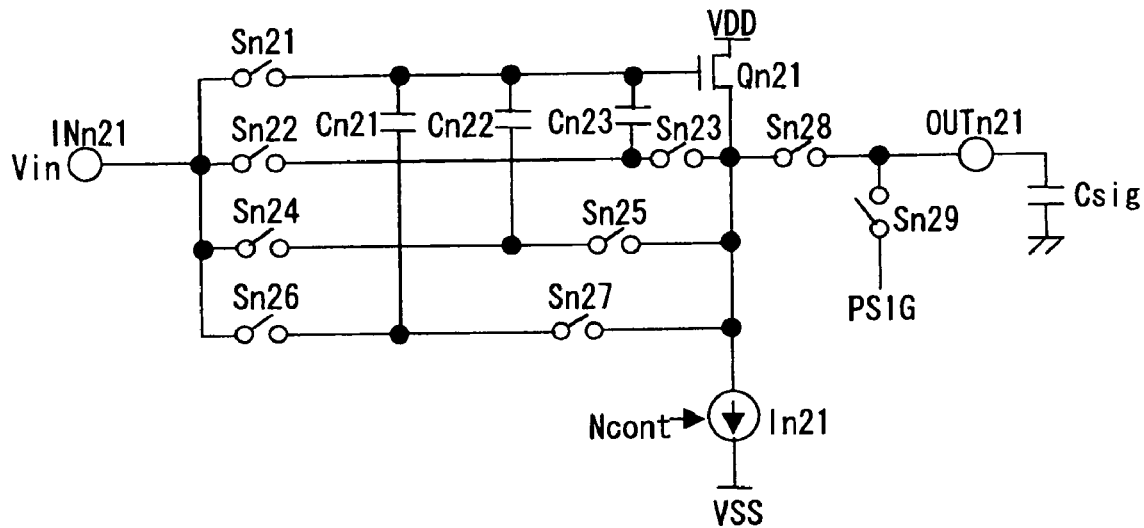
FIG. 17 is a circuit diagram showing an example of an N-type-buffer analog buffer circuit according to a second embodiment of the present invention.

FIG. 17 is a circuit diagram showing an example of an N-type-buffer analog buffer circuit according to a second embodiment of the present invention. The N-type-buffer analog buffer circuit includes an NMOS transistor and is used when output signal potential is relatively high, specifically, when it is higher than particular fixed potential PSIG, which is described later.

In FIG. 17, an NMOS transistor Qn21 as a source follower and a current source In21 are connected in series between a power supply VDD and a power supply VSS. A switch Sn21 is connected between a circuit input terminal INn21 and the gate of the NMOS transistor Qn21. Between the circuit input terminal INn21 and the source of the NMOS transistor Qn21, a switch Sn22 and a switch Sn23 are connected in series, a switch Sn24 and a switch Sn25 are connected in series, and a switch Sn26 and a switch Sn27 are connected in series.

A capacitor Cn2l is connected between the gate (the output end of the switch Sn21) of the NMOS transistor Qn21 and the output end (the input end of the switch Sn27) of the switch Sn26. A capacitor Cn22 is connected between the gate of the NMOS transistor Qn21 and the output end (the input end of the switch Sn25) of the switch Sn24. A capacitor Cn23 is connected between the gate of the NMOS transistor Qn21 and the output end (the input end of the switch Sn23) of the switch Sn22.

The seven switches Sn21 to Sn27 and the three capacitors Cn21 to Cn23 constitute an offset-canceling means which performs offset detection on the source follower (the NMOS transistor Qn21) three separate times and sequentially cancels the detected offsets.

A switch Sn28 is connected between the source of the NMOS transistor Qn21 and a circuit output terminal OUTn21. The circuit output terminal OUTn21 (the output end of the switch Sn28) connects to one end of a switch Sn29. The other end of the switch Sn29 is supplied with "L" level fixed potential PSIG.

Figure 18:
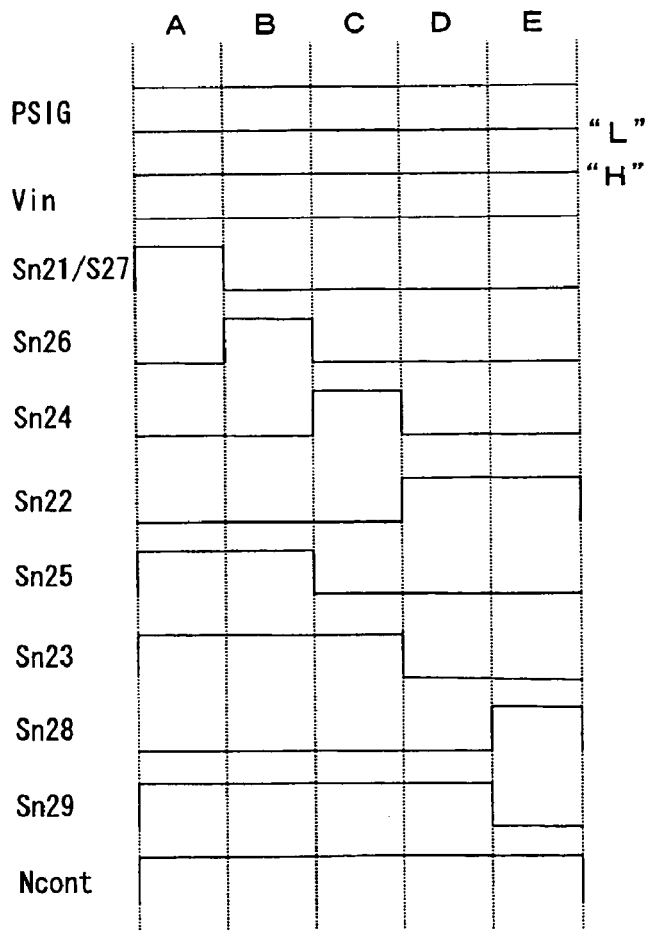
FIG. 18 is a timing chart serving to illustrate the operation of the N-type-buffer analog buffer circuit according to the second embodiment.

Subsequently, circuit operations of the analog buffer circuit according to the second embodiment, which has the above configuration, is described with reference to the timing chart in FIG. 18 by using the operation illustrations in FIG. 19 to FIG. 23. The analog buffer circuit performs outputting once by sequentially the following five operations to complete 1-cycle operation.

Figure 19:
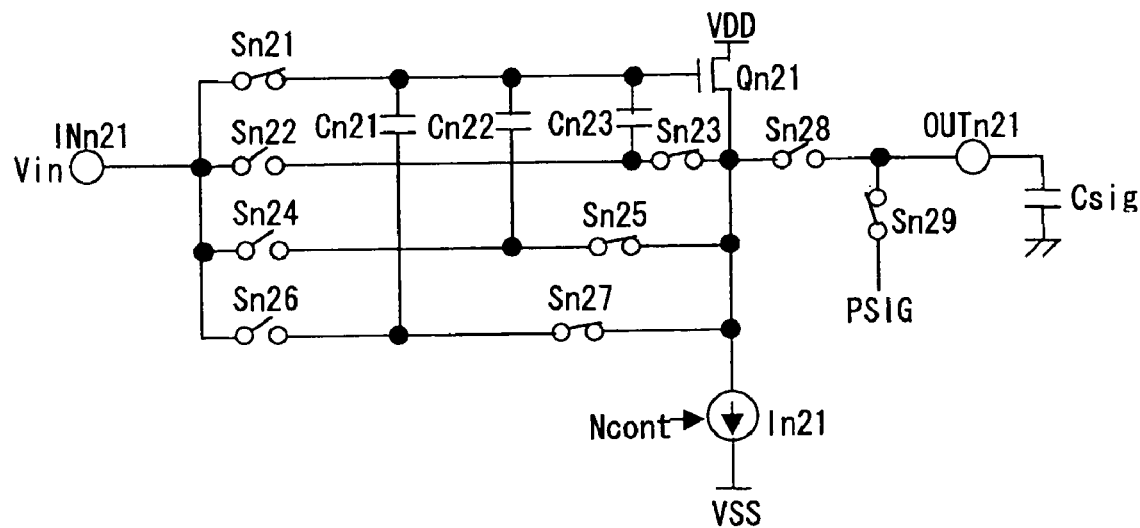
FIG. 19 is a diagram (#1) illustrating an N-type source follower in an analog buffer circuit according to an application of the second embodiment.

In a period A, as shown in FIG. 19, the switch Sn29 is in conduction, and an output load starts to be precharged at the fixed potential PSIG. Also, the switches Sn21, Sn23, Sn25, and Sn27 are in conduction, and a signal Vin is input to the gate of the NMOS transistor Qn21, so that three capacitors Cn21, Cn22, and Cn23 are connected across the gate and source of the NMOS transistor Qn21. This stores the gate-source voltage (VosA) at this time of the NMOS transistor Qn21 in the capacitors Cn21, Cn22, and Cn23.

Figure 20:
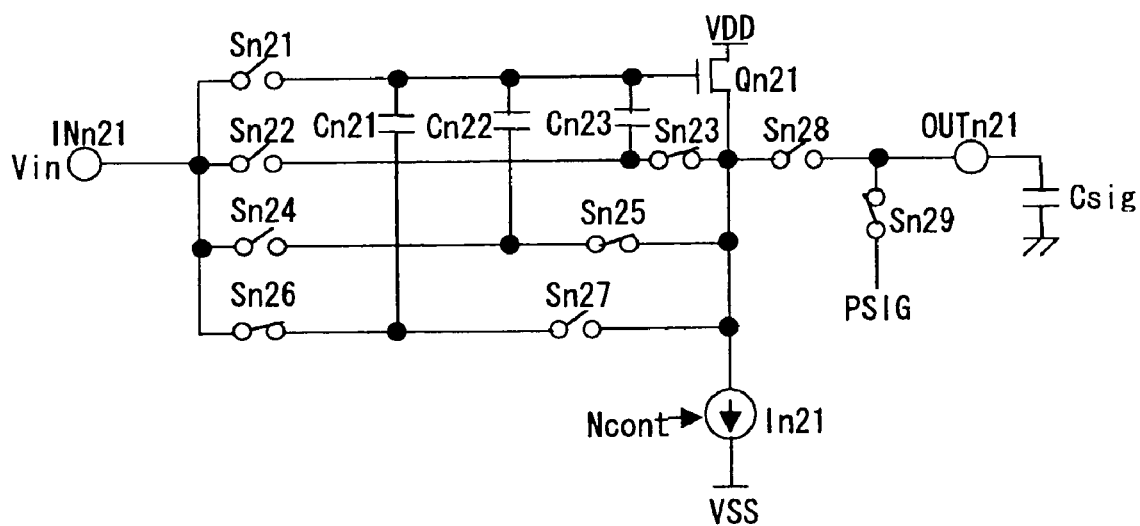
FIG. 20 is a diagram (#2) illustrating the N-type source follower in an analog buffer circuit according to the application of the second embodiment.

Next, in a period B, as FIG. 20 shows, the switches Sn21 and Sn27 are in nonconduction, and the switch Sn26 is in conduction. Then, the signal Vin is supplied to the other electrode of the leftist capacitor Cn21. Thus, the gate voltage of the NMOS transistor Qn21 changes in accordance with the voltage stored in the capacitor Cn21. Also, the two other capacitors Cn22 and Cn23 are still connected across the gate and source of the NMOS transistor Qn21, and the gate-source voltage (VosB) at this time is stored in the capacitors Cn22 and Cn23. The source voltage of the NMOS transistor Qn21 is approximately Vin+(VosA−VosB).

Figure 21:
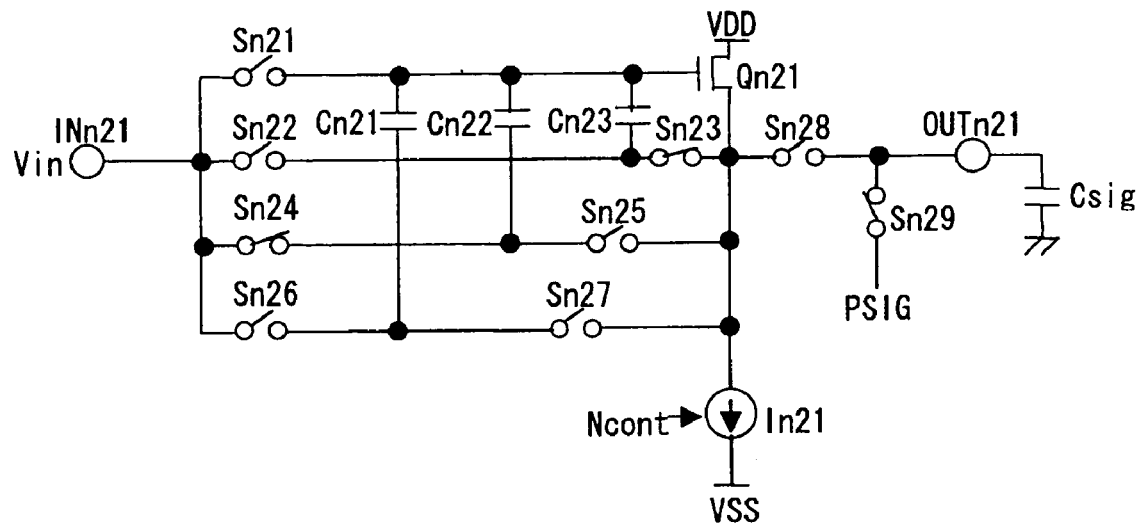
FIG. 21 is a diagram (#3) illustrating the N-type source follower in an analog buffer circuit according to the application of the second embodiment.

Next, in a period C, as FIG. 21 shows, the switches Sn25 and Sn26 are in nonconduction, and the switch Sn24 is in conduction. This inputs the signal Vin to the other electrode of the capacitor Cn22 in the center, and the gate voltage changes in accordance with the voltage stored in the capacitor Cn22. Let the gate-source voltage in this state be VosC, the source voltage is approximately Vin+(VosB−VosC).

Figure 22:
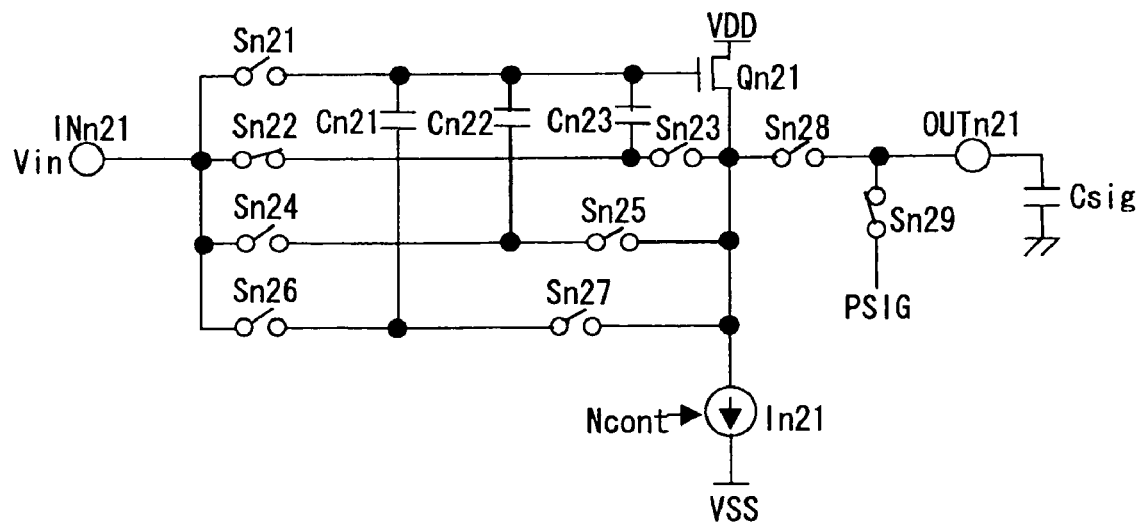
FIG. 22 is a diagram (#3) illustrating the N-type source follower in an analog buffer circuit according to the application of the second embodiment.

Next, in a period D, as FIG. 22 shows, the switches Sn23 and Sn24 are in nonconduction, and the switch Sn22 is in conduction. This inputs the signal Vin to the other electrode of the rightist capacitor Cn23, and the gate voltage changes in accordance with the voltage stored in the capacitor Cn23. Let the gate-source voltage at this time be VosD, the source voltage is approximately Vin+(VosC−VosD).

Figure 23:
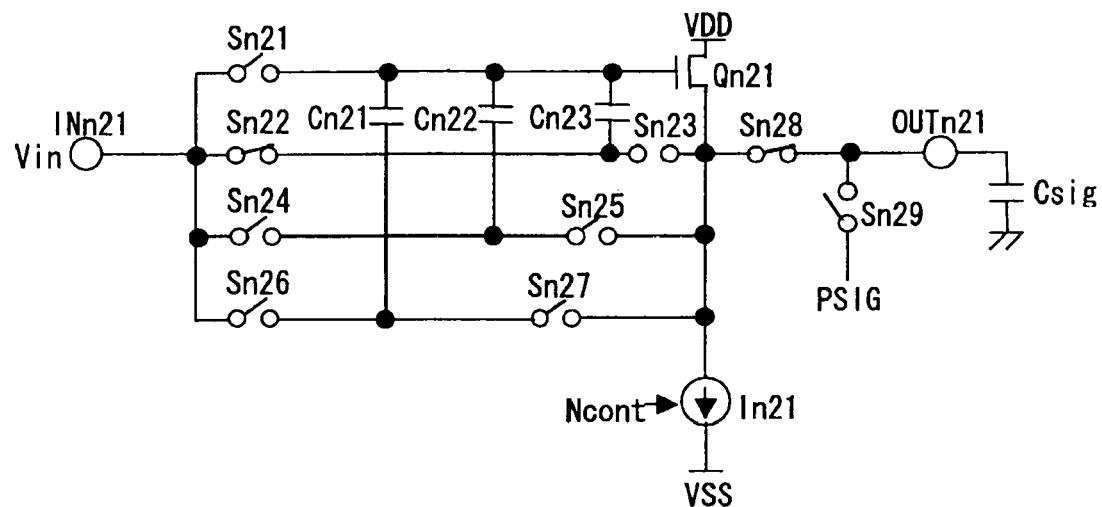
FIG. 23 is a diagram (#5) illustrating the N-type source follower in an analog buffer circuit according to the application of the second embodiment.

Finally, in a period E, as FIG. 23 shows, the switch Sn28 is in conduction, and the switch Sn29 is in nonconduction. This connects the output load to the source follower output (source) of the NMOS transistor Qn21, so that the source voltage Vin+(VosC−VosD) is output to the load. This operation in the period E can be performed so as to overlap with that in the period E from its beginning.

In the above-described operations, an important point is that the detection of the offset voltage VosC detected the third time is performed much closer to an operation point in the final output mode, compared with the offset voltage VosA detected the first time. This causes the offset voltage VosD to be very close to the offset voltage VosC, so that the final offset voltage (VosC−VosD) is sufficiently small. In other words, higher precision offset cancellation is achieved compared with the case of performing source follower offset detection two separate times.

As described above, according to the N-type-buffer analog buffer circuit according to the second embodiment, by performing source follower offset detection three separate times, the final offset voltage is reduced smaller than that in the case of performing the detection twice, and higher precision offset cancellation can be performed. Thus, an analog buffer circuit having very low offsets and reduced variation in potential is realized.

Figure 24:
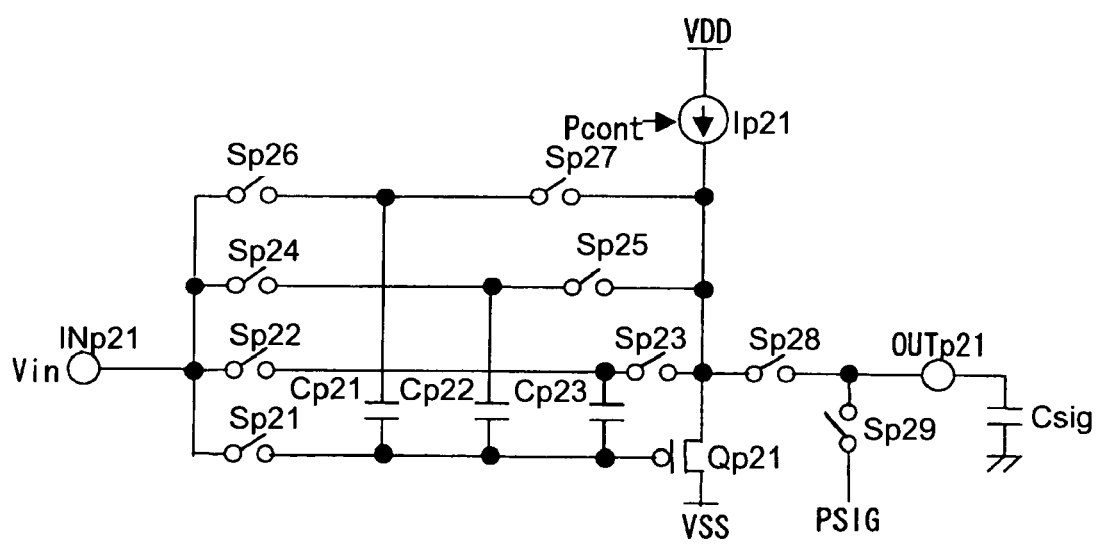
FIG. 24 is a circuit diagram showing an example of a P-type-buffer analog buffer circuit according to the second embodiment of the present invention.

FIG. 24 is a circuit diagram showing an example of a P-type-buffer analog buffer circuit according to the second embodiment of the present invention. The P-type-buffer analog buffer circuit includes a PMOS transistor and is used when output signal potential is relatively low, specifically, when it is lower than particular fixed potential PSIG.

In FIG. 24, a current source Ip21 and a PMOS transistor Qp21 as a source follower are connected in series between a positive power supply VDD and a negative power supply VSS. A switch Sp21 is connected between a circuit input terminal INp21 and the gate of the PMOS transistor Qp21. Between the circuit input terminal INp21 and the source of the PMOS transistor Qp21, a switch Sp22 and a switch Sp23 are connected in series, a switch Sp24 and a switch Sp25 are connected in series, and a switch Sp26 and a switch Sp26 are connected in series.

A capacitor Cp21 is connected between the gate (the output end of the switch Sp21) of the PMOS transistor Qp21 and the output end (the input end of the switch Sp27) of the switch Sp26. A capacitor Cp22 is connected between the gate of the PMOS transistor Qp21 and the output end (the input end of the switch Sp25) of the switch Sp24. A capacitor Cp23 is connected between the gate of the PMOS transistor Qp21 and the output end (the input end of the switch Sp23) of the switch Sp22.

The seven switches Sp21 to Sp27 and the three capacitors Cp21 to Cp23 constitute an offset-canceling means which performs offset detection on the source follower (the PMOS transistor Qp21) three separate times and sequentially cancels the detected offsets.

A switch Sp28 is connected between the source of the PMOS transistor Qp21 and a circuit output terminal OUTp21. The circuit output terminal OUTp21 (the output end of the switch Sp28) connects to one end of the switch Sp29. The other end of the switch Sp29 is supplied with "H" level fixed potential PSIG.

In the P-type-buffer analog buffer circuit having the configuration, the switches Sp21 to Sp29 and the capacitors Cp21, Cp22, and Cp23 respectively correspond to the switches Sn21 to Sn29 and the capacitors Cn21, Cn22, and Cn23 in the above-described N-type-buffer analog buffer circuit (see FIG. 17), circuit operations are identical to those in the N-type-buffer analog buffer circuit. In the timing chart in FIG. 18, the signal Vin is at "L" level, and the precharge potential PSIG is at "H" level. Also in the case of the P-type-buffer analog buffer circuit, operation and advantages identical to those in the N-type-buffer analog buffer circuit can be obtained.

(Application of Second Embodiment)

Figure 25:
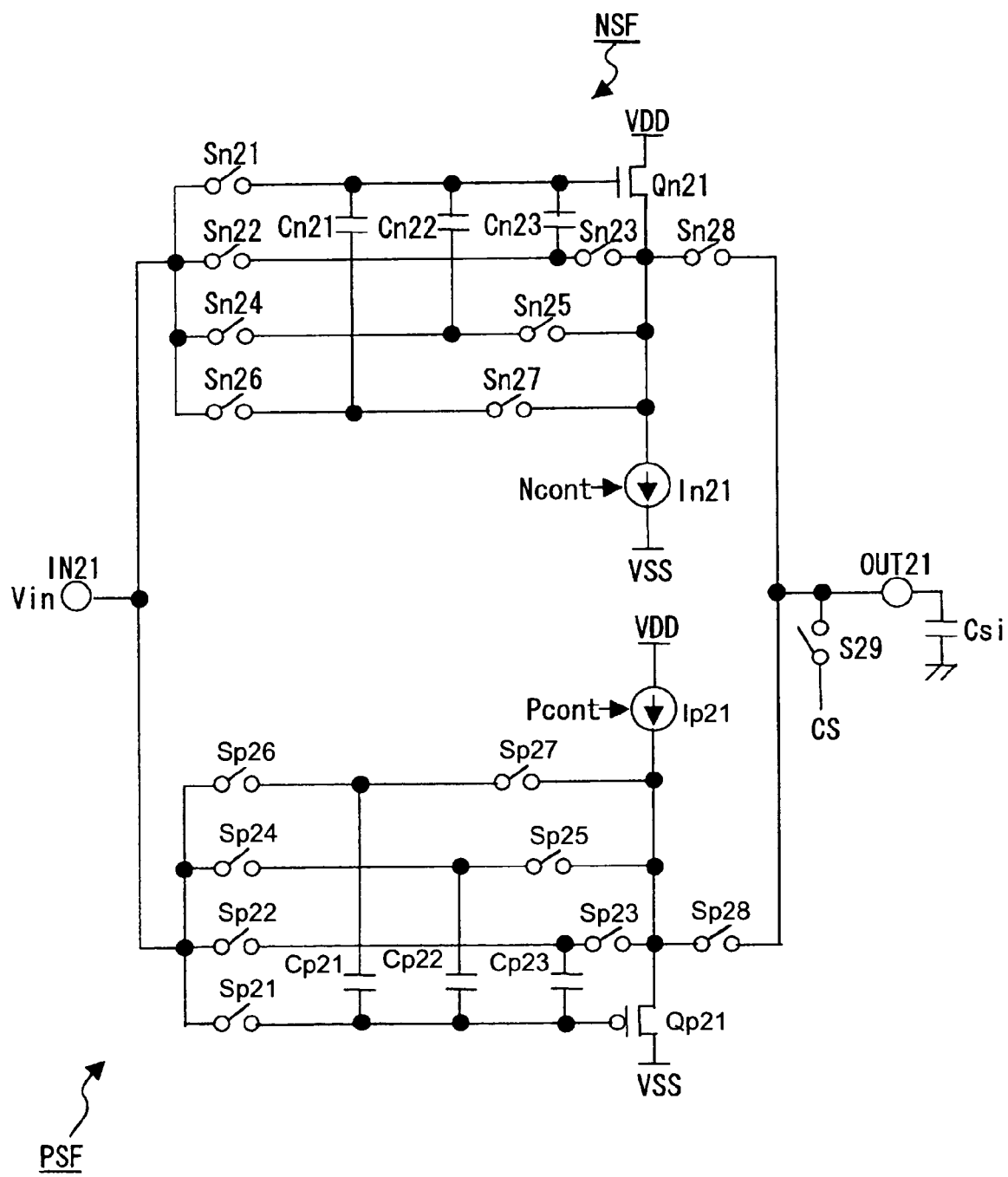
FIG. 25 is a circuit diagram showing an example of an analog buffer circuit according to an application of the second embodiment.

FIG. 25 is a circuit diagram showing an example of an analog buffer circuit according to an application of the second embodiment, and in this figure, equivalent portions in FIG. 17 and FIG. 24 are denoted by identical reference numerals. In the analog buffer circuit according to this application, in order to perform output load precharge in an alternating-current manner, a configuration that uses both an N-type-buffer analog buffer circuit and a P-type-buffer analog buffer circuit is employed.

In other words, in FIG. 25, between a circuit input terminal IN21 and a circuit output terminal OUT21, the N-type-buffer analog buffer circuit (N-type source follower NSF) shown in FIG. 17 and the P-type-buffer analog buffer circuit (P-type source follower PSF) in FIG. 24 are connected in parallel. Also, the circuit output terminal OUT21 (the output ends of the output ends of the switches Sn28, Sp28) connects to one end of the switch S29 (corresponding to the switches Sn29, Sn29). The other end of the switch S29 is supplied with alternating-current potential CS as output load precharge potential.

In the analog buffer circuit according to the application, the circuit operations of the N-type-buffer analog buffer circuit, which have been described with reference to the timing chart in FIG. 6 by using FIG. 19 to FIG. 23, and the circuit operations of a similar P-type-buffer analog buffer circuit are alternately performed in synchronization with polarity inversion of the precharge potential CS. As described above, by using, in combination, the precharge circuit (switch S29) and the N-type source follower NSF and the P-type source follower PSF, whose currents and connections are controlled in accordance with the polarity of output voltage, the output load can be precharged to preferable potential ("H" level/"L" level).

Although uses of the above-described analog buffer circuits according to the first and second embodiments are not particularly limited, the circuits are suitable for use in part of a peripheral driving circuit for driving a display unit. However, the present invention is not limited to application to a driving circuit for a display device, but will be useful particularly when the present invention is used as a single analog buffer circuit formed by TFTs on an insulating substrate.

Figure 26:
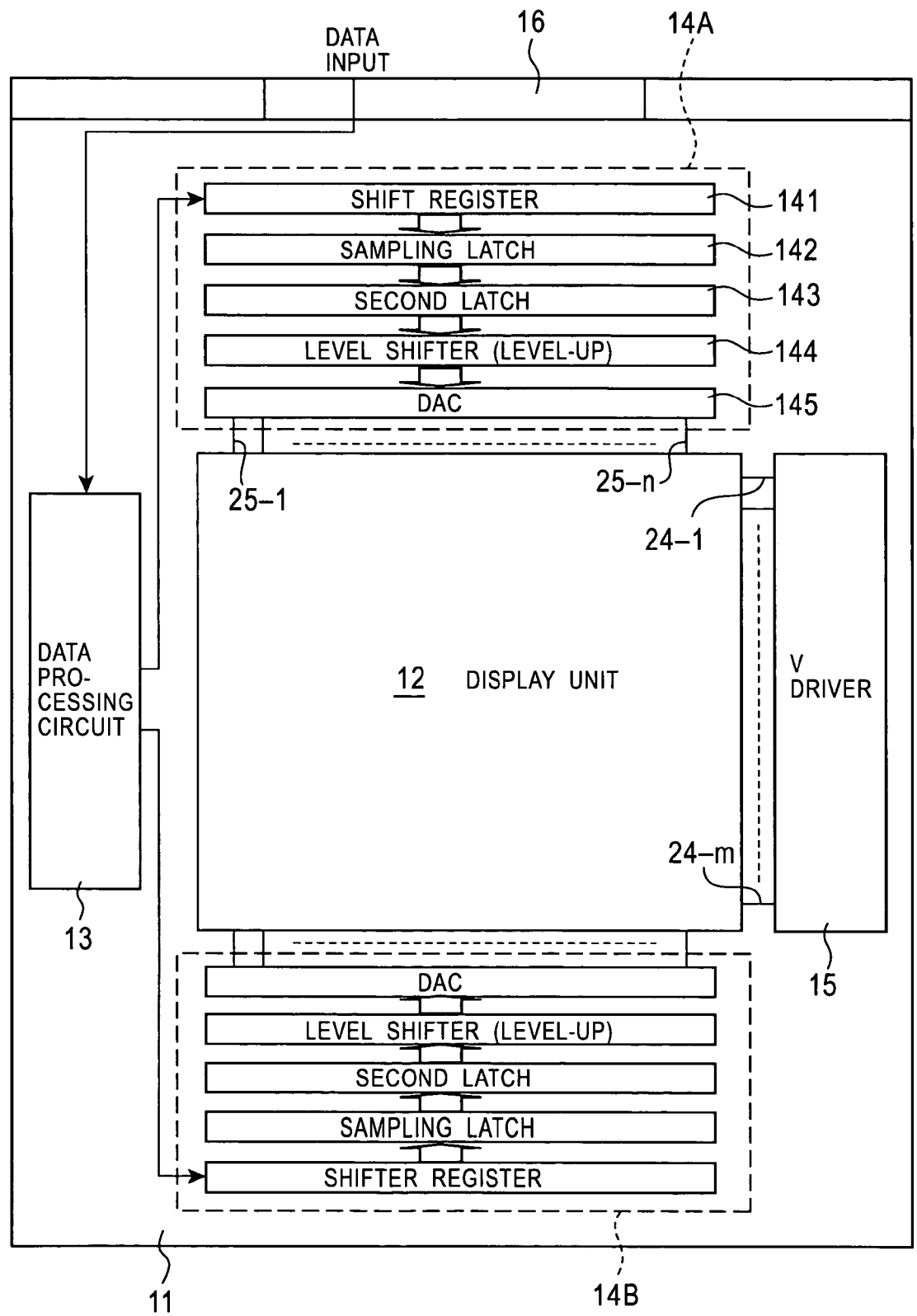
FIG. 26 is a block diagram showing an example of a driver-integrated liquid crystal display device of the present invention.

FIG. 26 is a block diagram showing an example of a driver-integrated display device, for example, a liquid crystal display device. In FIG. 26, on a transparent insulating substrate, for example, a glass substrate 11, a display unit (pixel unit) 12 composed of pixels in a matrix is formed. The glass substrate 11 is provided opposing another glass substrate, with a predetermined gap therebetween, and liquid crystal material is encapsulated between both substrates, whereby a display panel (LCD panel) is formed.

Figure 27:
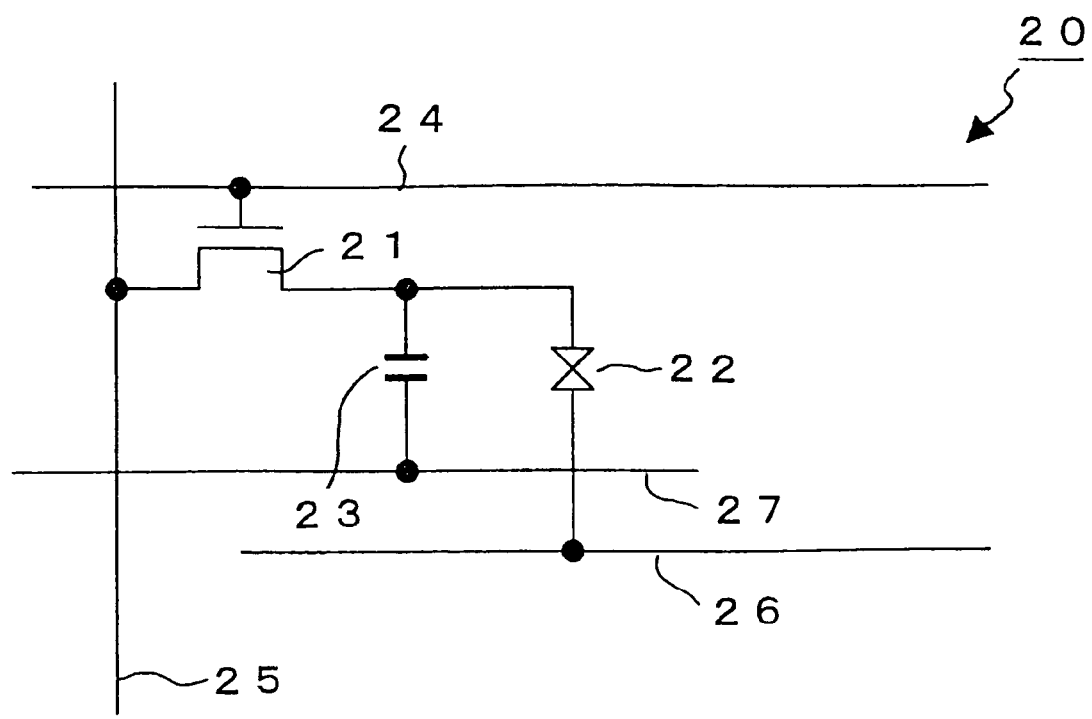
FIG. 27 is a circuit diagram showing an example of the structure of a pixel in a display unit.

One example of pixel structure in the display unit 12 is shown in FIG. 27. Each pixel 20 includes a TFT (thin film transistor) 21 as a pixel transistor, a liquid crystal cell 22 having a pixel electrode connected to the drain electrode of the TFT 21, and a hold capacitor 23 having one electrode connected to the drain electrode of the TFT 21. Here, the liquid crystal cell 22 means a liquid crystal capacitor produced between the pixel electrode and a counter electrode formed so as to be opposed thereto.

In this structure, the TFT 21 has a gate electrode connected to a gate line (scanning line) 24 and a source electrode connected to a data line (signal line) 25. In the liquid crystal cell 22, the counter electrode is connected to a VCOM line 26 in common for each pixel. A common voltage VCOM (VCOM potential) is supplied in common for each pixel to the counter electrode in the liquid crystal cell 22 by using the VCOM line 26. The other electrode (terminal on the counter electrode) of the hold capacitor 23 is connected to a CS line 27 in common for each pixel.

Here, in the case of performing 1H (H is a horizontal period) inversion driving or 1F (F is a field period) inversion driving, a display signal which is written in each pixel is inverted in polarity, with the VCOM potential as a reference. Also, in the case of using VCOM inversion driving in which the polarity of VCOM potential is inverted in cycles of 1H or 1F, together with the 1H inversion driving or the 1F inversion driving, also the polarity of the CS potential supplied to the CS line 27 is inverted in an alternating-current manner in synchronization with the VCOM potential.

Here, an alternating-current voltage which is almost identical in amplitude to the CS potential is used as the VCOM potential. Actually, when a signal is written in the pixel electrode in the liquid crystal cell 22 from the data line 25 through the TFT 21, a voltage drop occurs in the TFT 21 due to parasitic capacitance, etc. Accordingly, an alternating-current voltage which is DC-shifted for the voltage drop is used as the VCOM potential.

Referring to FIG. 26 again, on the same glass substrate 11 with the display unit 12, for example, a data processing circuit 13 on the left side of the display unit 12, horizontal drivers (horizontal driving circuits) 14A and 14B on th upper and lower sides of the display unit 12, and a vertical (V) driver (vertical driving circuit) 15 on the right side of the display unit 12 are provided as peripheral driving circuits. These are only shown as part of peripheral driving circuits, and they are not limited to these. Also, the horizontal drivers 14A and 14B may be disposed on either upper or lower side of the display unit 12. The peripheral driving circuits are formed by using low temperature polysilicon or CG (Continuous Grain Crystal) silicon, with the pixel transistors in the display unit 12.

In the liquid crystal display device having the above configuration, display data Data is input as R (red), G (green), and B (blue) parallel inputs having a low voltage amplitude (e.g., an amplitude of 0 V to 3.3 V) from the substrate exterior through an input pad unit 16, and is level-shifted (level-converted) to one having an high voltage amplitude (e.g., 0 V to 6.5 V) by the data processing circuit 13. The level-shifted display data Data is supplied to the horizontal drivers 14A and 14B.

The horizontal driver 14A has a digital driver structure including, for example, a horizontal shift register 141, a data sampling latch unit 142, a second latch unit 143, a level shifter 144, and a DA (digital to analog) converting circuit 145. Also the horizontal driver 14B is identical to the horizontal driver 14A in structure.

The horizontal shift register 141 starts a shift operation in response to a horizontal start pulse HST supplied from a timing generating circuit (not shown), and generates sampling pulses which are sequentially transferred in one horizontal period in synchronization with a horizontal clock pulse HCK supplied from the timing generating circuit. The data sampling latch unit 142 sequentially samples and latches, in one horizontal period, the display data Data supplied from the data processing circuit 13 in synchronization with the sampling pulses generated by the horizontal shift register 141.

The latched digital data for one line is transferred to the second latch unit 143 in a horizontal blanking period. Digital data for one line is all output from the second latch unit 143. The output digital data for one line is increased in level by the level shifter 144, and is supplied and converted into analog display signals by the DA converting circuit 145. The analog display signals for one line, output from the DA converting circuit 145, are output to data lines 25-1 to **25-*n* formed corresponding to the number n of horizontal pixels in the display unit 12**.

The vertical driver 15 includes a vertical shift register and a gate buffer. In the vertical driver 15, the vertical shift register starts a shift operation in response to a vertical start pulse VST supplied from a timing generating circuit (not shown), and generates scanning pulses which are sequentially transferred in one vertical period in synchronization with a vertical clock pulse VCK supplied from the timing generating circuit. The generated scanning pulses are sequentially output to gate lines 24-1 to **24-*m*** formed corresponding to the number m of vertical pixels.

By using vertical scanning of the vertical driver 15 to sequentially output the scanning pulses to the gate lines 24-1 to **24-*m*, the pixels in the display unit 12 are sequentially selected in units of rows (lines). The analog display signals for one line are simultaneously written in the selected pixels for one line through the data lines 25-1 to 25-*n***. By repeating the line-unit writing operation, image display for one screen is performed.

In the liquid crystal display device having the above configuration, by providing, in an integrated form, the peripheral circuits, such as the data processing circuit 13, the horizontal drivers 14A and 14B, and the vertical driver 15, on the same panel (the glass substrate 11) with the display unit 12, a display panel integrated with all driving circuits can be constituted, and it is not required that another substrate, an IC, and a transistor circuit be provided in the exterior. Thus, this enables size reduction and reduced cost of the entire system.

In the driver-integrated liquid crystal display device, to constitute, for example, the DA converting circuit 145, an analog buffer circuit according to the above-described first or second embodiment, or its application, is used.

[First Applied Case]

Figure 28:
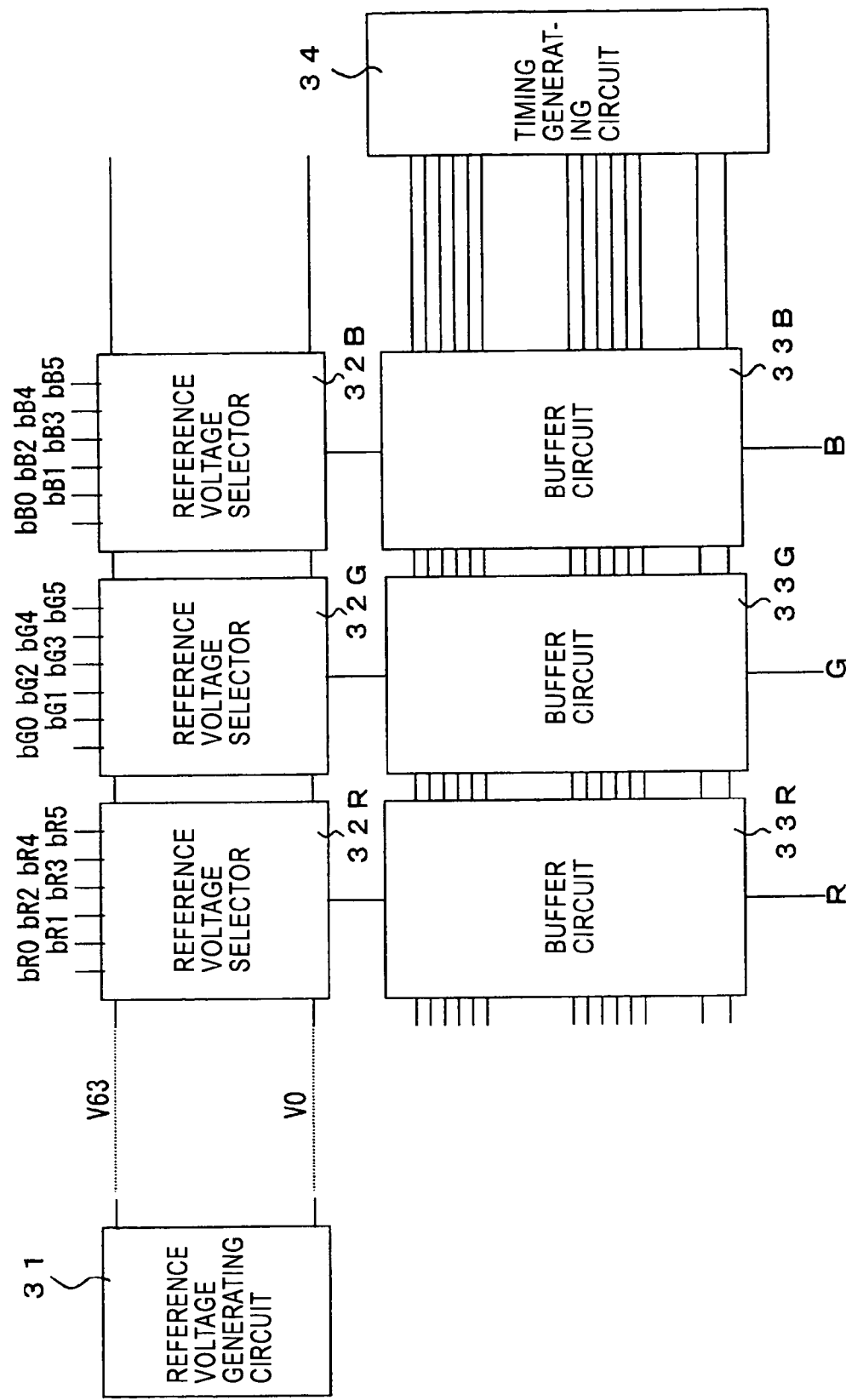
FIG. 28 is a block diagram showing an example of a reference-voltage-selecting DA converting circuit according to a first applied case of the present invention.

FIG. 28 is a block diagram showing an example of a reference-voltage-selecting DA converting circuit. Here, for example, R (red), G (green), and B (blue) 6-bit digital data, bR0 to bR5, bG0 to bG5, and bB0 to bB5, is supplied as the display data Data.

Figure 29:
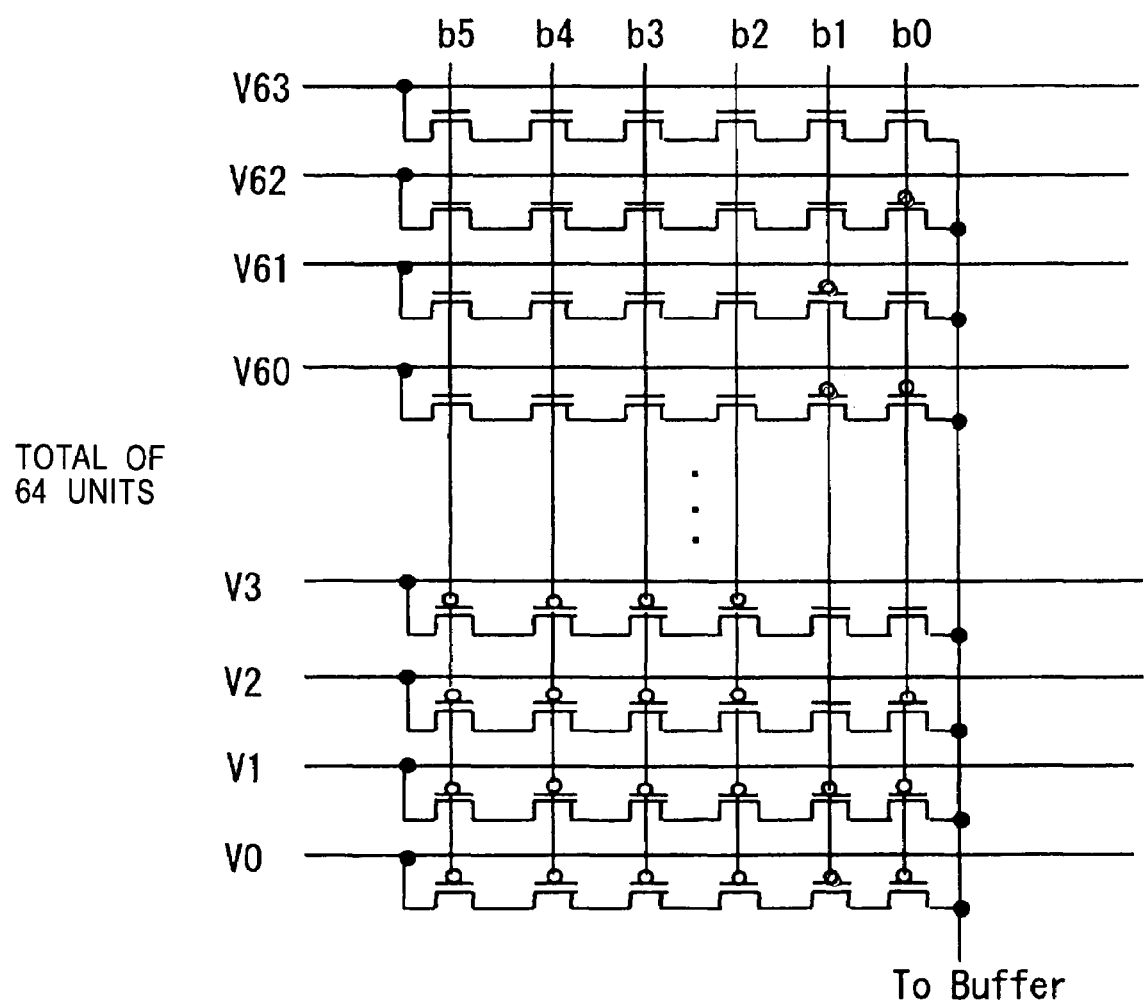
FIG. 29 is a circuit diagram showing an example of a reference voltage selector.

In FIG. 28, a reference voltage generating circuit 31 generates reference voltages V0 to V63 for 64 gray-scale levels corresponding to 6-bit display data Data. These reference voltages V0 to V63 are supplied to reference voltage selectors 32R, 32G, and 32B. The reference voltage selectors 32R, 32G, and 32B are provided for the data lines 25-1 to **25-*n* in the display unit 12, and select and output, from among the reference voltages V0 to V63 for 64 gray-scale levels, reference voltages corresponding to bR0 to bR5, bG0 to bG5, and bB0 to bB5 as analog display signals. Each example of reference voltage selectors 32R, 32G, and 32B is shown in FIG. 29**.

Buffer circuits 33R, 33G, and 33B are provided on the output sides of the reference voltage selectors 32R, 32G, and 32B, that is, between the output sides and the data lines 25-1 to **25-*n*. The reason that the buffer circuits 33R, 33G, and 33B** are provided are as follows:

Enlarged screen size, increased resolution, or the like, of the liquid crystal display device increases a capacitive load such as parasitic capacitance generated in each of the data lines 25-1 to **25-*n*. To charge/discharge the capacitive load in a predetermined time, corresponding driving capability is required. Therefore, the buffer circuits 33R, 33G, and 33B** are required.

In this applied case, the analog buffer circuits according to the first embodiment, the second embodiment, or its application, which are described above, are used as the buffer circuits 33R, 33G, and 33B. Since the analog buffer circuits have very low offsets and reduced variation in output potential as described above, there is not any problem when they are formed on an insulating substrate such as the glass substrate 11 by using TFTs.

Accordingly, even if analog buffer circuits according to the first embodiment, the second embodiment, or its application, are arranged as the analog buffer circuits 33R, 33G, and 33B, variations in offsets between the analog buffer circuits can be suppressed. Thus, vertical stripes caused by the offset variations do not occur, so that display quality (uniformity) can be increased. In addition, enabling the provision of the buffer circuits 33R, 33G, and 33B can increase driving capability for the capacitive loads of the data lines 25-1 to **25-*n***. Thus, a large, high-resolution driver-integrated liquid crystal display device is realized.

Also, in the case of using analog buffer circuits according to the first or second embodiment, or its application, in the horizontal drivers 14A and 14B for performing VCOM inversion driving, very good convenience is obtained. This is because it is preferable, in a power consumption viewpoint, that the data lines 25-1 to **25-*n*** be precharged to a particular gray-scale level (e.g., white level in a normally white liquid crystal display device, and black level in a normally black liquid crystal display device), and the white level or the black level changes in an alternating-current manner in response to VCOM inversion.

In other words, by using the CS potential (potential which is inverted in an alternating-current manner in synchronization with the VCOM potential, as described above) to be supplied to the CS line 27, as the precharge potential CS in FIG. 5 or FIG. 25, the CS potential is at a gray-scale level (white level in a normally white liquid crystal display device, and black level in a normally black liquid crystal display device) in a mode of applying no voltage to the liquid crystal. Accordingly, driving of the data lines 25-1 to **25-*n*** may be started at the gray-scale level, so that less driving current is sufficient, thus enabling a reduction in power consumption.

In this applied case, the switch S7 in FIG. 5 and the switch S29 in FIG. 25 are used as precharge switches. In the analog buffer circuits according to the applications of the first and second embodiments, a switch signal for performing ON/OFF driving of each switch, control signals Ncont and Pcont for performing ON/OFF driving of the power supply, and a precharge signal for performing ON/OFF driving of the precharge switch are generated by a timing generating circuit 34 (see FIG. 28).

[Second Applied Case]

Figure 30:
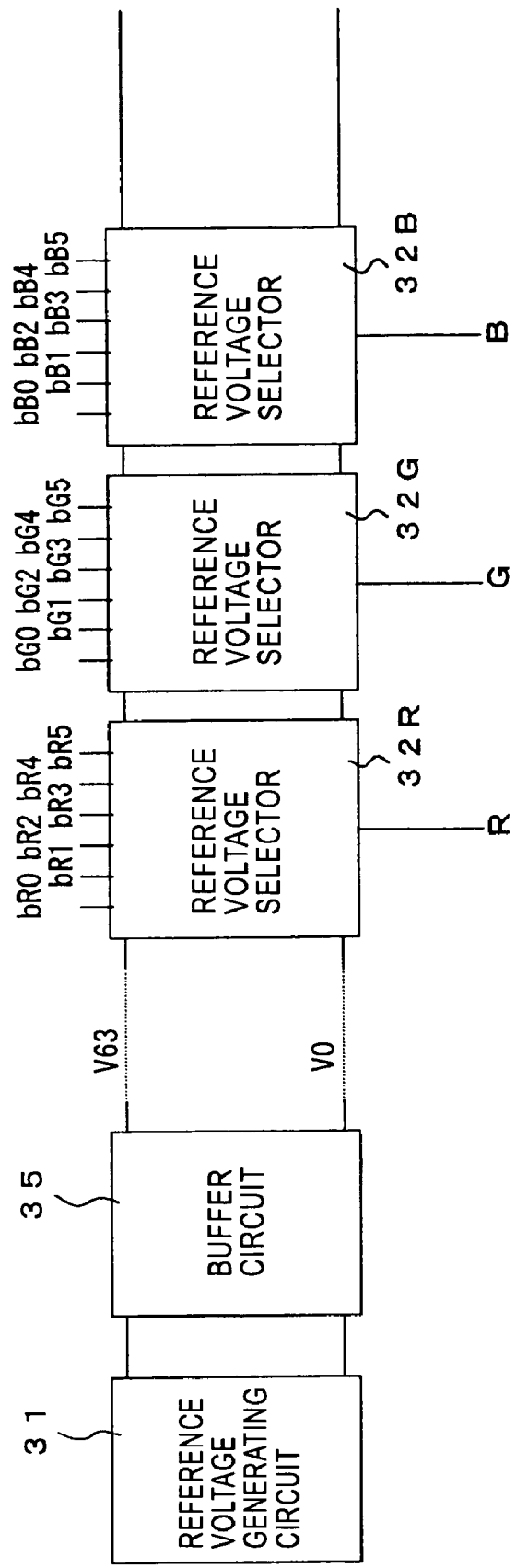
FIG. 30 is a block diagram showing an example of a reference-voltage-selecting DA converting circuit according to a second applied case of the present invention.

In the reference-voltage-selecting DA converting circuit, particularly when the number of horizontal pixels in the display unit 12 increases, the numbers of reference voltage selectors 32R, 32G, and 32B accordingly increase and the lengths of wires for transmitting reference voltages V0 to V63 accordingly increase. Therefore, as FIG. 30 shows, a buffer circuit 35 is provided after the stage of a reference voltage generating circuit 31 for increasing driving capability. Although the buffer circuit 35 is here indicated by one block, actually buffer circuits 35 are provided so as to correspond to reference voltages V0 to V63.

Also, in this applied case, the analog buffer circuit according to the first or second embodiment, or its application, which is described above, is used as the buffer circuit 35. In the First Applied Case, the buffer circuits 33R, 33G, and 33B handle reference voltages V0 to V63 obtained after selection by the selectors 32R, 32G, and 32B, while, in this applied case, the buffer circuit 35 handles reference voltages V0 to V63 obtained before selection by the selectors 32R, 32G, and 32B.

Since the same reference voltages V0 to V63 are handled after all, a manner of using the analog buffer circuit according to the first or second embodiment, or its application, is similar to that in the First Applied Case. Therefore, for the same reason as described above, very good convenience is obtained, in particular, in the case of using the analog buffer circuit in the first or second embodiment, or its application.

As described above, by using the analog buffer circuit in the first or second embodiment, or its application, as the buffer circuit 35 for the reference voltage generating circuit 31, relative variations in potential among reference voltages V0 to V63 can be reduced because the analog buffer circuit has very low offsets and reduced variation in output potential. This performs display driving at analog display signal levels accurately corresponding to digital data bR0 to bR5, bG0 to bG5, and bB0 to bB5, thus enabling display of a higher quality image.

[Third Applied Case]

Figure 31:
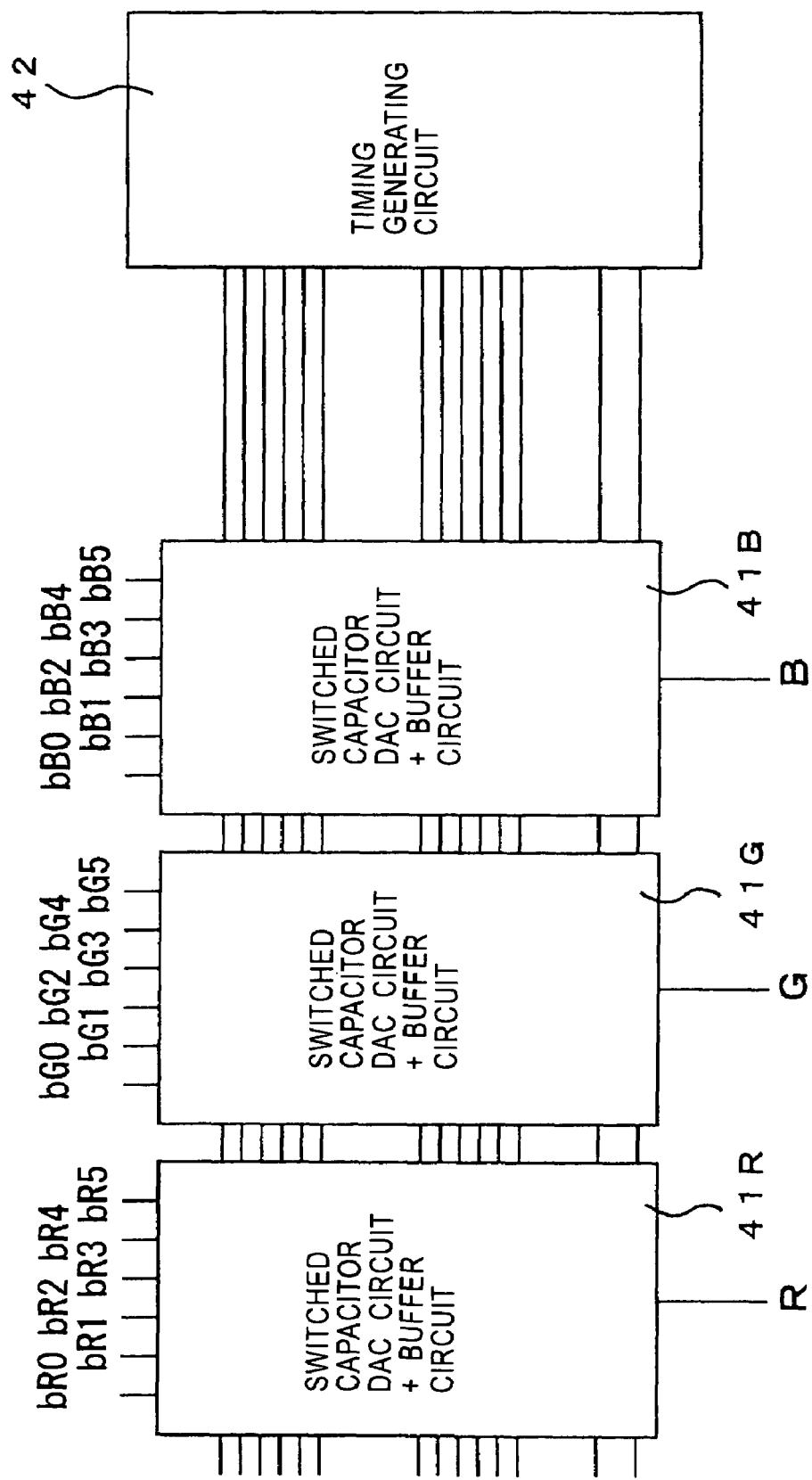
FIG. 31 is a block diagram showing an example of a switched capacitor DA converting circuit according to a third applied case of the present invention.

FIG. 31 is a block diagram showing an example of the configuration of switched capacitor DA converting circuits. It is here assumed that, for example, R (red), G (green), and B (blue) 6-bit digital data, bR0 to bR5, bG0 to bG5, bB0 to bB5 are supplied.

In FIG. 31, switched capacitor DA converting circuits 41R, 41G, and 41B are provided for the data lines 25-1 to 25-n in the display unit 12. The switched capacitor DA converting circuits 41R, 41G, and 41B have built-in buffer circuits for the same reason as in the reference voltage selecting DA converting circuit. In this applied case, the analog buffer circuit in the first or second embodiment, or its application, is used as this buffer circuit.

Figure 32:
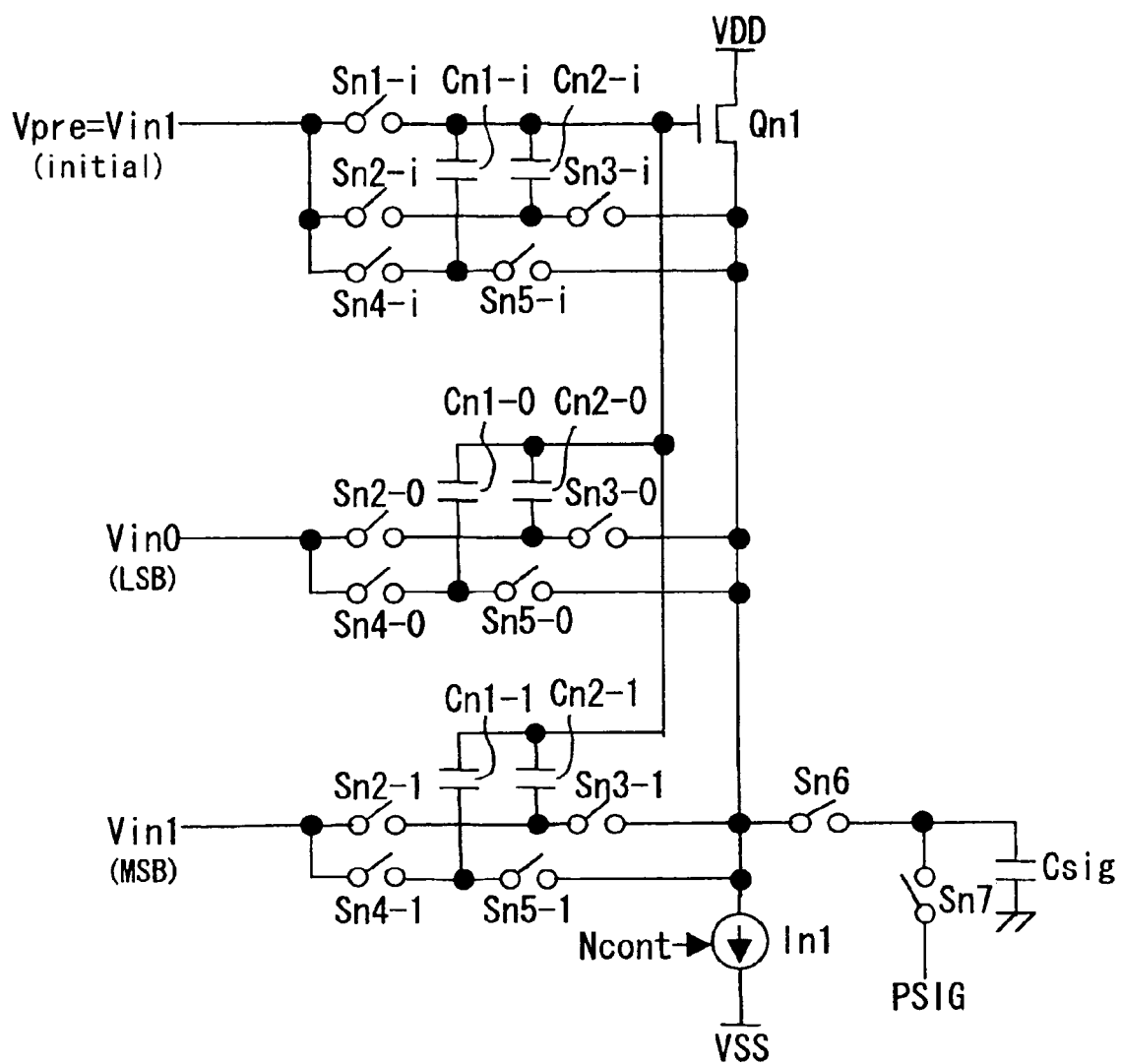
FIG. 32 is a circuit diagram showing a specific example of the internal structure of the switched capacitor DA converting circuit according to the third applied case.

FIG. 32 is a circuit diagram showing a specific example of the internal configuration of the switched capacitor DA converting circuit according to the Third Applied Case. For ease of understanding, this specific example shows a case in which the switched capacitor DA converting circuit is constituted by using two bits and the N-type-buffer analog buffer circuit according to the first embodiment in FIG. 1 is combined with the 2-bit switched capacitor DA converting circuit.

In FIG. 32, in a view in comparison with the circuit in FIG. 1, on the side of input data Vin0 of a lower bit (LSB) a first switches-and-capacitor group composed of switches Sn2-0, Sn3-0, Sn4-0, and Sn5-0, and capacitors Cn1-0, and Cn2-0 is provided, and on the side of input data Vin1 of an upper bit (MSB), a second switches-and-capacitor group composed of switches Sn2-1, Sn3-1, Sn4-1, and Sn5-1, and capacitors Cn1-1 and Cn2-1 is provided. Also, a third switches-and-capacitor group composed of switches Sn1-i, Sn2-i, Sn3-i, Sn4-i, and Sn5-i, and capacitors Cn1-i and Cn2-i which are connected to fixed potential Vin1 (initial) for numerical matching is provided. An NMOS transistor Qn1 and a current supply In1 in the buffer portion, and switches Sn6 and Sn7 in the output portion are identical to those in the case of FIG. 1.

In the built-in-buffer switched capacitor DA converting circuit having the above configuration, the capacitance of the capacitors Cn1-i and Cn2-i in the third switches-and-capacitor group is set to be equal to the capacitance of the capacitors Cn1-0 and Cn2-0 in the first switches-and-capacitor group, and the capacitance of the capacitors Cn1-1 and Cn2-1 in the second switches-and-capacitor group is set to be ½ of each of the above capacitances. Also, since input data Vin0 and Vin1 are binary data having 1 ("H" level)/0 ("L" level), the input performs switching. As a result, an analog voltage is output in accordance with a difference in each potential of the input data Vin0 and Vin1. Here, since the operation of the switched capacitor DA converting circuit is known, its description is here omitted.

Figure 33:
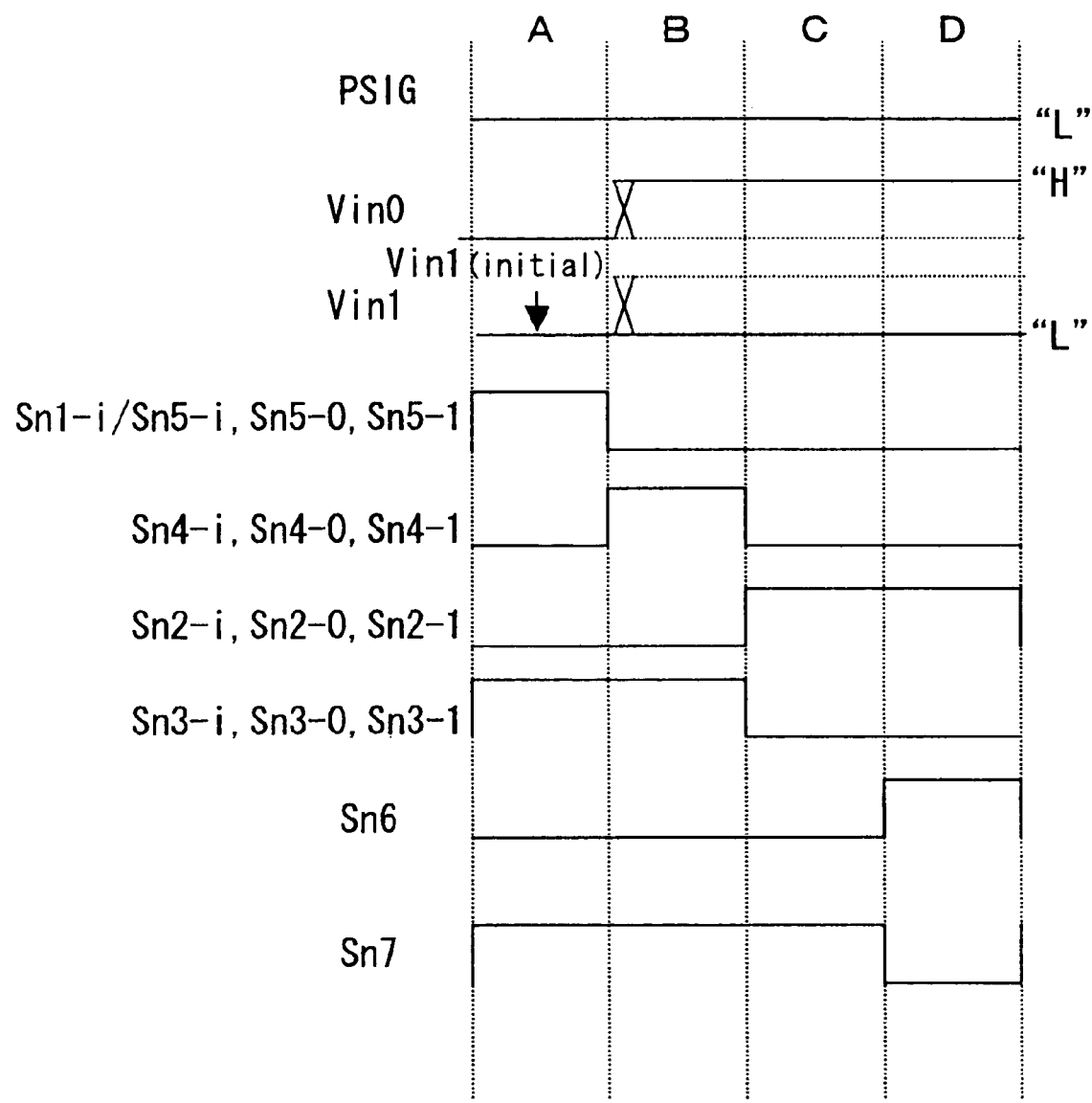
FIG. 33 is a timing chart serving to illustrate the operation of the switched capacitor DA converting circuit according to the third applied case.

Also, the buffer circuit portion has an offset-canceling function, and its circuit operation is similar to the case of the N-type-buffer analog buffer circuit according to the first embodiment. Its timing chart is shown in FIG. 33. A switch signal for performing ON/OFF driving of each switch, control signals Ncont and Pcont for performing ON/OFF driving of a current source, and a precharge signal for performing ON/OFF driving of a precharge switch are output by the timing generating circuit 42.

The above offset-canceling operation can reduce offsets, thus reducing a variation in output potential. Therefore, by combining the N-type-buffer analog buffer circuit according to the first embodiment with the switched capacitor DA converting circuit, operation and advantages similar to those in the First Applied Case are obtained. In addition thereto, as is clear from the circuit configuration in FIG. 32, the capacitors Cn2-0 and Cn2-1, which correspond to the capacitor Sn2 in FIG. 1, can also be used as switched capacitors.

Although this applied case exemplifies a case in which the N-type-buffer analog buffer circuit according to the first embodiment is combined with the switched capacitor DA converting circuit, the P-type-buffer analog buffer circuit according to the first embodiment, the analog buffer circuit according to the application of the first embodiment, or the analog buffer circuit according to the second embodiment or its application can be similarly combined for use.

(Application of Third Applied Case)

Figure 34:
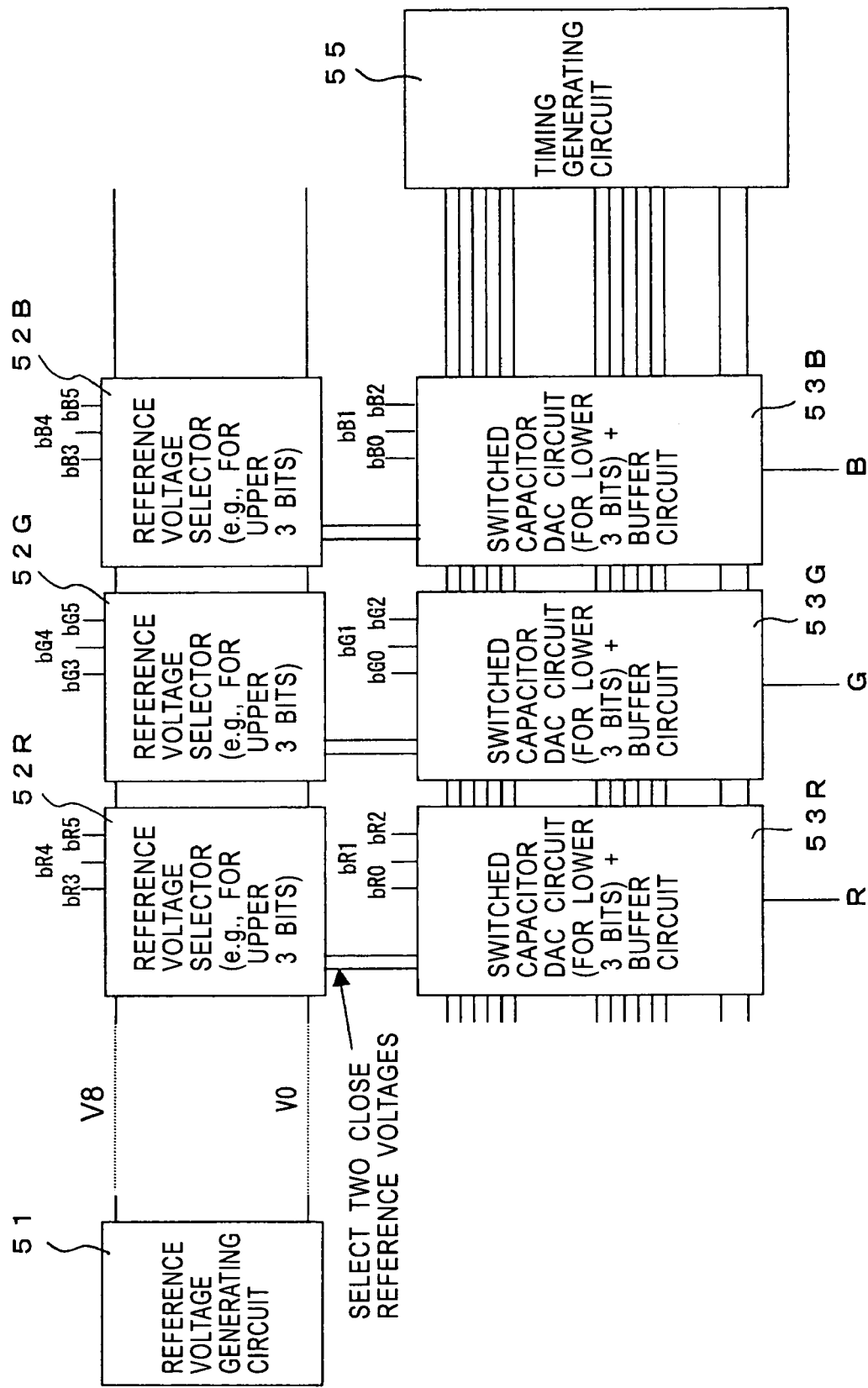
FIG. 34 is a block diagram showing an example of a reference-voltage-selecting D/C converting circuit according to the third applied case of the present invention.

FIG. 34 is a block diagram showing an example of the configuration of a reference-voltage-selecting DA converting circuit according to an application of the third Applied Case. The reference-voltage-selecting DA converting circuit according to this application is a DA converting circuit in which reference voltage selectors and switched capacitors are used in combination. It is here assumed that, for example, R, G, and B 6-bit digital data bR0 to bR5, bG0 to bG5, and bB0 to bB5 are supplied as display data Data.

A reference voltage generating circuit 51 generates not reference voltages for 64 gray-scale levels for 6-bit digital data bR0 to bR5, bG0 to bG5, and bB0 to bB5, but, for example, reference voltages V0 to V8 for 9 coarser gray-scale levels. The reference voltages V0 to V8 are supplied to the reference voltage selectors 52R, 52G, and 52B. The reference voltage selectors 52R, 52G, and 52B selectively output two adjacent reference voltages from among the reference voltages V0 to V8, for example, for upper 3-bit data, bR3 to bR5, bG3 to bG5, and bB3 to bB5 from among 6-bit digital data, bR0 to bR5, bG0 to bG5, and bB0 to bB5.

The selected two reference voltages are input to switched capacitor DA converting circuits,53R, 53G, and 53B, with lower 3-bit data, bR0 to bR2, bG0 to bG2, and bB0 to bB2 among the 6-bit digital data, bR0 to bR5, bG0 to bG5, and bB0 to bB5. The switched capacitor DA converting circuits 53R, 53G, and 53B include circuit portions in their input stages which generate 3-bit data, Vin0, Vin1, and Vin2 having, between the two reference voltages, levels corresponding to the lower 3-bit data, bR0 to bR2, bG0 to bG2, and bB0 to bB2.

The generated 3-bit data, Vin0, Vin1, and Vin2, are supplied to the original switched capacitor DA converting portions. It is the circuit in FIG. 32 that indicates a basic circuit in a case in which N-type-buffer analog buffer circuits according to the first embodiment are combined with the switched capacitor DA converting portions. The circuit in FIG. 32 is adapted for 2-bit data, Vin0 and Vin1. In a case for 3 bits, one circuit portion of capacitors and switches is added.

As described above, also in the DA converting circuit in which the reference voltage selectors and the capacitors are used in combination, analog buffer circuits according to the first or second embodiment, or its application, can be combined for the switched capacitor DA converting circuits 53R, 53G, and 53B.

In each above-described applied case, an example of application to a liquid crystal display device composed of liquid crystal cells as display elements is described. The application is not limited to the applied case, but the application is possible to various types of display devices in each of which an analog buffer circuit is provided on the same substrate as a display unit is provided, such as EL display devices using EL (electroluminescence) elements as display elements.

Display devices as typified by the above-described liquid crystal display devices according to the applied cases are suitable for use as screen display units for small, lightweight portable terminals.

Figure 35:
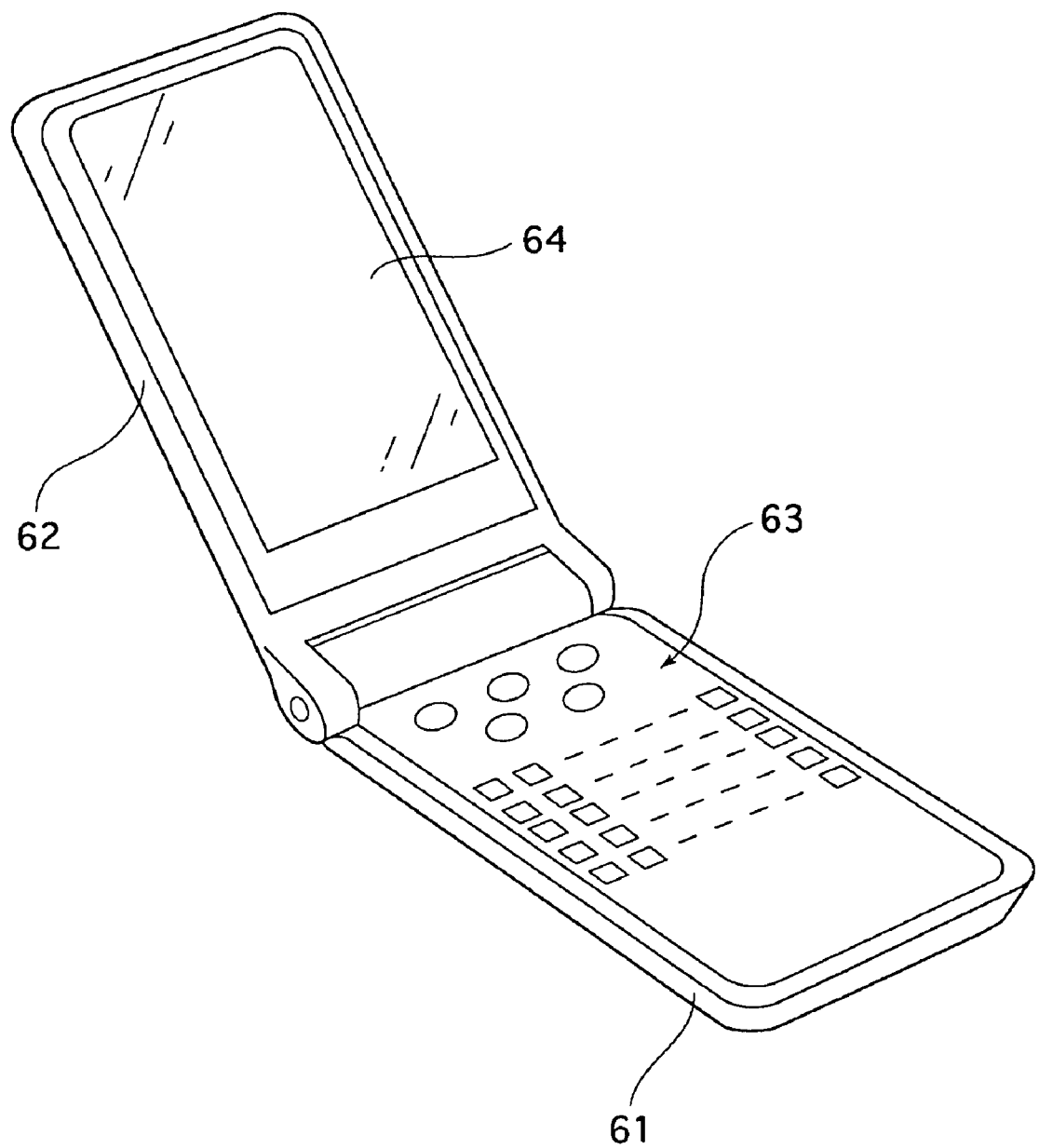
FIG. 35 is an exterior view showing an outline of the structure of a PDA of the present invention.

FIG. 35 is an exterior view showing an outline of the structure of a portable terminal of the present invention, for example, a PDA.

The PDA in this embodiment has, for example, a folding structure in which a cover 62 is provided to a main device unit 61 so as to be opened and closed. On the top surface of the main device unit 61, an operation unit 63 having an arrangement of various keys, such as a keyboard, is disposed. Also, on the cover 62, a screen display unit 64 is disposed. As the screen display unit 64, a liquid crystal display device is used in which the above-described DA converting circuit according to the first, second, or third applied case is provided on the same substrate with the display unit.

According to the liquid crystal display devices according to the above applied cases, as described above, integration with driver circuits is easily realized, and moreover, enlarged screen size, increased resolution, and increased image quality can be achieved, and also power consumption can be reduced. Therefore, provision of the liquid crystal display device as the screen display unit 64 can contribute to simplification in the entire structure, enlargement in screen size, and increased resolution and image quality, and reduced power consumption of the screen display unit 64 achieves extension of a battery-powered consecutive usable life.

Although the application to the PDA has been here described as an example, the liquid crystal display device is not limited to this applied case, but is suitable for use in various types of small, lightweight portable terminals, particularly in cellular telephones.

As described above, according to the present invention, by performing source-follower offset detection a plural number of separate times, a final offset voltage can be sufficiently reduced, and high precision offset cancellation can be performed, thus realizing an analog buffer circuit having very low offsets and reduced variation in output potential.

The invention claimed is:

1. An analog buffer circuit comprising:
  a source-follower circuit portion for driving an output load; and
  an offset-canceling circuit portion for performing offset detection on said source-follower circuit portion a plural number of times per cycle and sequentially canceling the detected offsets prior to outputting a final offset corrected signal, wherein said source-follower circuit portion includes a first source-follower circuit portion comprising an NMOS transistor and second source-follower circuit portion comprising a PMOS transistor, and said first source-follower circuit portion and said second source-follower circuit portion become active in accordance with a polarity of precharge potential for precharging the output load.

2. An analog buffer circuit according to claim 1, wherein said analog buffer circuit is formed on an insulating substrate by thin film transistors.

3. An analog buffer circuit comprising:
  a source-follower circuit portion for driving an output load; and
  an offset-canceling circuit portion for performing offset detection on said source-follower circuit portion a plural number of times per cycle and sequentially canceling the detected offsets prior to outputting a final offset corrected signal, wherein said source-follower circuit portion includes a current source comprising: a first MOS transistor which comes into conduction/nonconduction in accordance with the polarity of a control signal;
  a second MOS transistor connected in series to a MOS transistor as a source follower; and
  a third MOS transistor connected in series to said first MOS transistor and which combines with said second MOS transistor to form a current-mirror circuit.

4. A display device comprising:
  a display unit comprised of pixels arranged in a matrix on a transparent insulating substrate; and
  a digital-to-analog (DA) converting circuit which is provided on the transparent insulating substrate with said display unit and which supplies analog signals to data lines in said display unit after converting digital signals into the analog signals,
  wherein said DA converting circuit further includes an analog buffer circuit comprising:
  a source-follower circuit portion for driving the data lines; and
  an offset-canceling circuit portion for performing offset detection on said source-follower circuit portion a plural number of times per cycle and sequentially canceling the detected offsets prior to outputting a final offset corrected signal and further
  wherein each of said pixels includes a liquid crystal cell, said display device further comprising a precharge circuit portion for precharging the data lines at precharge potential corresponding to a gray-scale level in a mode of applying no voltage to one of the liquid crystal cells; and
  said source-follower circuit portion includes a first source-follower circuit portion comprising an NMOS transistor and a second source-follower circuit portion comprising a PMOS transistor, and said first source-follower circuit portion and said second source-follower circuit portion become active in accordance with the polarity of the precharge potential.

5. A display device comprising:
  a display unit comprised of pixels arranged in a matrix on a transparent insulating substrate; and
  a digital-to-analog (DA) converting circuit which is provided on the transparent insulating substrate with said display unit and which supplies analog sianals to data lines in said display unit after converting digital signals into the analog signals,
  wherein said DA converting circuit further includes an analog buffer circuit comprising:
  a source-follower circuit portion for driving the data lines; and
  an offset-canceling circuit portion for performing offset detection on said source-follower circuit portion a plural number of times per cycle and sequentially canceling the detected offsets prior to outputting a final offset corrected signal and further wherein said DA converting circuit is a reference-voltage-selecting/switched-capacitor DA converting circuit including a reference voltage generating circuit for generating a plurality of reference voltages corresponding to the number of gray-scale levels supported, a reference voltage selector for selectively outputting, from among the reference voltages, two adjacent reference voltages corresponding to upper bits of the digital display signals, and a switched capacitor circuit for outputting the analog display signals which correspond to lower bits of the digital display signals and which are generated by using the two adjacent reference voltages selected by said reference voltage selector, and said DA converting circuit is formed by disposing said analog buffer circuit in an output stage of said switched capacitor circuit.

* * * * *